(12) United States Patent
Huang

(10) Patent No.: US 12,080,335 B2
(45) Date of Patent: Sep. 3, 2024

(54) SIGNAL SAMPLING CIRCUIT AND SEMICONDUCTOR MEMORY

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 120 days.

(21) Appl. No.: 17/934,185

(22) Filed: Sep. 21, 2022

(65) Prior Publication Data

US 2023/0009525 A1    Jan. 12, 2023

Related U.S. Application Data

(63) Continuation of application No. PCT/CN2022/091428, filed on May 7, 2022.

(30) Foreign Application Priority Data

Mar. 23, 2022 (CN) .......................... 202210294955.7

(51) Int. Cl.
*G11C 11/4076* (2006.01)
*H03K 3/037* (2006.01)
(Continued)

(52) U.S. Cl.
CPC .......... *G11C 11/4076* (2013.01); *H03K 3/037* (2013.01); *H03K 5/135* (2013.01); *H03K 19/20* (2013.01)

(58) Field of Classification Search
CPC .......... G06F 1/183; G06F 3/0688; G06F 1/26; G06F 3/061; G06F 3/0653; G06F 3/0679;
(Continued)

(56) References Cited

U.S. PATENT DOCUMENTS 10,002,651 B2 * 6/2018 Choi .................... G11C 29/00
10,679,683 B1 6/2020 Chen
(Continued)

OTHER PUBLICATIONS

Extended European Search Report in Application No. 22932862.0, mailed on Jun. 11, 2024.

*Primary Examiner* — Uyen Smet
(74) *Attorney, Agent, or Firm* — Syncoda LLC; Feng Ma

(57) ABSTRACT

A signal sampling circuit includes the following: a signal input circuit, configured to determine a to-be-processed instruction signal and a to-be-processed chip select signal; a first instruction sampling circuit, configured to perform two-stage sampling and logic operation processing on the to-be-processed chip select signal according to a first clock signal to obtain a first chip select clock signal; a second instruction sampling circuit, configured to perform two-stage sampling and logic operation processing on the to-be-processed chip select signal according to the first clock signal to obtain a second chip select clock signal; and an instruction decoding circuit, configured to perform decoding and sampling processing on the to-be-processed instruction signal according to be to-be-processed chip select signal and one of the first chip select clock signal and the second chip select clock signal to obtain a target instruction signal.

20 Claims, 14 Drawing Sheets

(51) Int. Cl.
*H03K 5/135* (2006.01)
*H03K 19/20* (2006.01)

(58) Field of Classification Search
CPC ........... G06F 3/0604; G11C 5/04; G11C 8/10;
G11C 8/12; G11C 11/4076; G11C
14/0018; G11C 16/0483; G11C 16/30;
G11C 5/14; Y02D 10/00; H03K 19/20;
H03K 3/037; H03K 5/135
See application file for complete search history.

(56) References Cited

U.S. PATENT DOCUMENTS

| | | |
|---|---|---|
| 2012/0025871 A1 | 2/2012 | Song |
| 2018/0102150 A1* | 4/2018 | Choi ..................... G11C 29/028 |
| 2021/0090624 A1* | 3/2021 | Kim ..................... G11C 29/023 |
| 2022/0020408 A1 | 1/2022 | Kim |

* cited by examiner

SIGNAL SAMPLING CIRCUIT AND SEMICONDUCTOR MEMORY

CROSS-REFERENCE TO RELATED APPLICATIONS

This is a continuation application of International Patent Application No. PCT/CN2022/091428 filed on May 7, 2022, which claims priority to Chinese Patent Application No. 202210294955.7 filed on Mar. 23, 2022. The disclosures of the above-referenced applications are hereby incorporated by reference in their entirety.

BACKGROUND

With continuous development of semiconductor technology, people have put forward higher and higher requirements for the transmission speed of data when manufacturing and using equipment such as a computer. In order to obtain faster data transmission speed, a series of devices such as a memory that can transmit data at Double Data Rate (DDR) are emerged.

In a Dynamic Random Access Memory (DRAM) chip, a Command/Address (CMD/ADD, or CA for short) signal can be sampled as an address and can be sampled and decoded as an instruction. At present, in the DRAM chip, a pulse width of a chip select signal used by a 2T CMD signal and a pulse width of a chip select signal used by an NT ODT CMD signal are different, and corresponding operation functions of the 2T CMD signal and the NT ODT CMD signal are also different. However, in the existing instruction decoding solution, the two types of instructions are easy to be confused, which causes decoding errors.

SUMMARY

The disclosure relates to the technical field of integrated circuits, and in particularly, to a signal sampling circuit and a semiconductor memory.

According to a first aspect of the disclosure, in an embodiment, there is provided a signal sampling circuit. The signal sampling circuit includes a signal input circuit, a first instruction sampling circuit, a second instruction sampling circuit, and an instruction decoding circuit.

The signal input circuit is configured to determine a to-be-processed instruction signal and a to-be-processed chip select signal according to a first clock signal, a first chip select signal, and a first command address signal, here a clock cycle of the first clock signal is twice a preset clock cycle.

The first instruction sampling circuit is configured to perform, responsive to a pulse width of the first chip select signal being the preset clock cycle, two-stage sampling and logic operation processing on the to-be-processed chip select signal according to the first clock signal, to obtain a first chip select clock signal.

The second instruction sampling circuit is configured to perform, responsive to the pulse width of the first chip select signal being twice the preset clock cycle, two-stage sampling and logic operation processing on the to-be-processed chip select signal according to the first clock signal, to obtain a second chip select clock signal.

The instruction decoding circuit is configured to perform decoding and sampling processing on the to-be-processed instruction signal according to the to-be-processed chip select signal and the first chip select clock signal to obtain a target instruction signal, or perform decoding and sampling processing on the to-be-processed instruction signal according to the to-be-processed chip select signal and the second chip select clock signal to obtain the target instruction signal.

According to a second aspect of the disclosure, in an embodiment, there is provided a semiconductor memory. The semiconductor memory includes the signal sampling circuit as described in the first aspect.

The embodiments of the disclosure provide a signal sampling circuit and a semiconductor memory. Based on the signal sampling circuit, in a case that the pulse widths of the first chip select signals are different, two types of instructions, i.e., 2T CMD and NT ODT CMD, can be correctly distinguished according to the obtained first chip select clock signal and second chip select clock signal, and decoded accurately without affecting each other.

DETAILED DESCRIPTION

Figure 1:
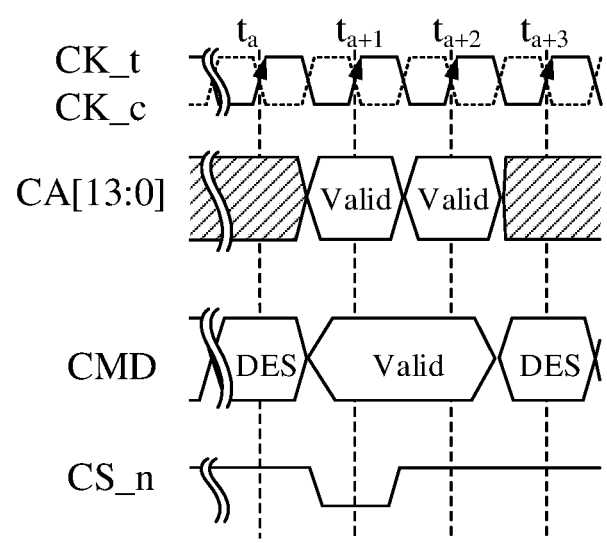
FIG. 1 is a schematic diagram of a signal timing sequence of two clock cycle commands.

The technical solutions in the embodiments of the disclosure will be clearly and completely described below in conjunction with the drawings in the embodiments of the disclosure. It is understood that the specific embodiments described herein are only used for explaining the related disclosure, rather than limiting the disclosure. In addition, it is to be noted that, for the convenience of description, only the parts related to the related disclosure are illustrated in the drawings.

Unless otherwise defined, all technical and scientific terms used herein have the same meanings as commonly understood by one of ordinary skill in the art to which the disclosure belongs. The terms used herein are merely intended to describe the embodiments of the disclosure, rather than limiting the disclosure.

In the following description, reference is made to "some embodiments" which describe a subset of all possible embodiments, but it is understood that "some embodiments" may be the same subset or different subsets of all possible embodiments, and may be combined with each other without conflict.

It is pointed out that the term "first\second\third" involved in the embodiments of the disclosure is only used for distinguishing similar objects, and does not represent a specific ordering of objects. It is understood that "first\second\third" may be interchanged where permitted in a specific order or sequence, to enable the embodiments of the disclosure described herein to be practiced in sequences other than those illustrated or described herein.

The following are the explanations of the professional terms involved in the embodiments of the disclosure and the corresponding relationship of some terms:

Dynamic Random Access Memory (DRAM)
Synchronous Dynamic Random Access Memory (SDRAM)
Double Data Rate (DDR)
4th DDR (DDR4)
5th DDR (DDR5)
Command/Address (CMD/ADD, or CA for short)
Clock Input (CLK)
Chip Select Input (CS)
Buffer/Repeater (RPT)
On-Die Termination (ODT)
Command Decoder (CMD DEC)
Data Flip-Flop or Delay Flip-Flop (DFF)
Process, Voltage, Temperature (PVT)
2Tck Command (2T CMD)
Non-Target On-Die Termination Command (NT ODT CMD)

It is understood that, taking the DDR5 DRAM design as an example, the CA input may be sampled as an address and may be sampled and decoded as an instruction. CA here is the general name of various command address signals of DRAM, which may include a Row Address Strobe (RAS), a Column Address Strobe (CAS), a write command (Write, WE), an active command (Active, ACT) and other command signals, as well as address signals such as A13-A0. In addition, in practical applications, the command address signal includes several-bit address signals, which may be specifically determined according to the specifications of the DRAM, and is not limited in the embodiments of the disclosure.

In the 2T CMD mode of the DDR5 DRAM, referring to FIG. 1, there is illustrated a schematic diagram of a signal timing sequence of two clock cycle commands In FIG. 1, CK_t and CK_c are a pair of input complementary clock signals, CA[13:0] is a CA signal input, CMD is an instruction signal obtained after the CA signal is decoded, and CS_n is a chip select signal indicating that the CA signal is valid. As illustrated in FIG. 1, CA[13:0] is a signal that lasts for two clock cycles. CA in the first clock cycle and CA in the second clock cycle need to be sampled as address signals. CA in the first clock cycle also needs to be sampled and decoded as an instruction signal. Specifically, in the DDR5 DRAM, CA[4:0] in the first clock cycle is sampled and decoded as an instruction signal.

Figure 2:
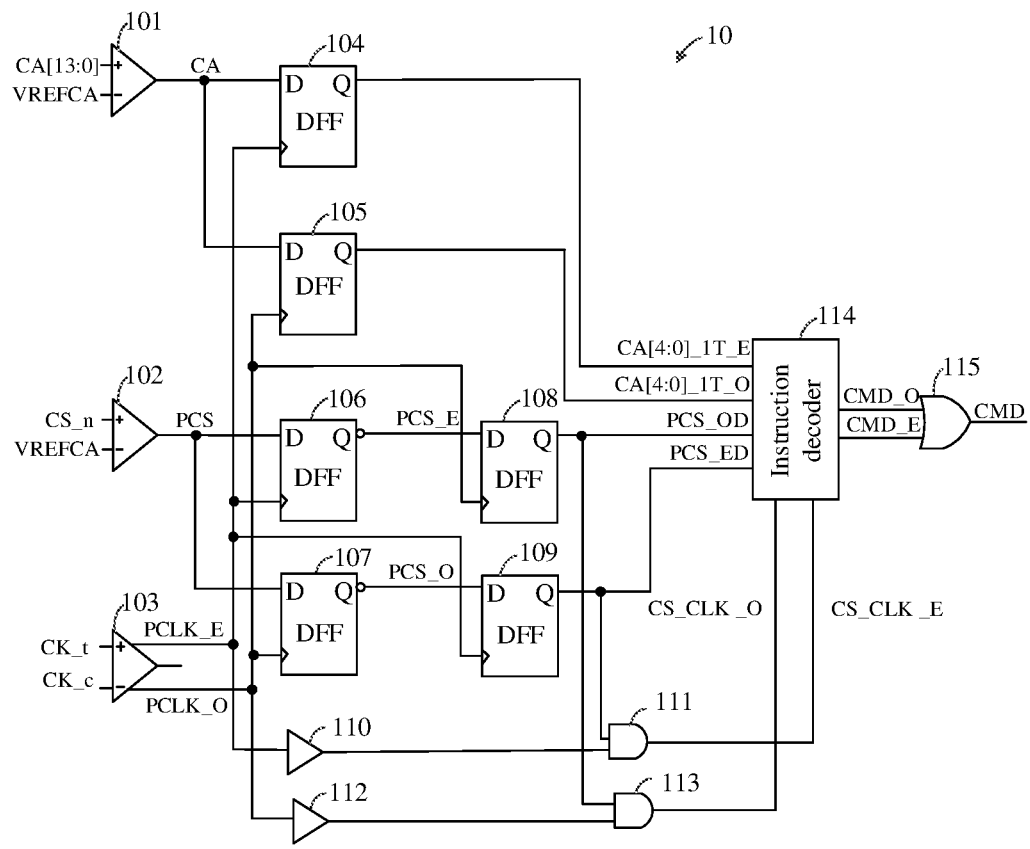
FIG. 2 is a schematic diagram of a composition structure of a signal sampling circuit.

Exemplarily, FIG. 2 illustrates a schematic diagram of a composition structure of a signal sampling circuit. As illustrated in FIG. 2, the signal sampling circuit 10 may include a first receiver 101, a second receiver 102, a third receiver 103, a first sampling circuit 104, a second sampling circuit 105, a third sampling circuit 106, a fourth sampling circuit 107, a fifth sampling circuit 108, a sixth sampling circuit 109, a first buffer 110, a first AND gate 111, a second buffer 112, a second AND gate 113, an instruction decoder 114 and an OR gate 115. The first sampling circuit 104, the second sampling circuit 105, the fifth sampling circuit 108, and the sixth sampling circuit 109 may be composed of D-type flip-flops, and the third sampling circuit 106 and the fourth sampling circuit 107 may be composed of D-type flip-flops and inverters.

In FIG. 2, input signals of the first receiver 101 are an initial command address signal (represented by CA[13:0]) and a reference signal (represented by VREFCA), and an output signal is a first command address signal (represented by CA). Input signals of the second receiver 102 are an initial chip select signal (represented by CS_n) and a reference signal (represented by VREFCA), and an output signal is a first chip select signal (represented by PCS). Input signals of the third receiver 103 are a pair of input complementary clock signals (represented by CK_t and CK_c), and output signals are a first clock even signal (represented by PCLK_E) and a first clock odd signal (represented by PCLK_O). It is to be noted that the third receiver 103 also has a frequency division processing capability. Therefore, the frequency of each of the PCLK_E signal and the PCLK_O signal is half the frequency of the CK_t signal or the CK_c signal, that is, the clock cycle of each of the PCLK_E signal and the PCLK_O signal is twice the clock cycle of the CK_t signal or the CK_c signal, and a phase difference is 180 degrees. In addition, it is also to be noted that CA[13:0] here represents a group of signals, which is the combined term of CA[0], CA[1], . . . , CA[13]. Correspondingly, the first receiver 101 actually includes 14 receiving circuits, as well as output lines, even includes the following sampling circuits, and there are also 14 long wiring paths, which have one-to-one correspondence to CA[0], CA[1], . . . , CA [13].

Then, the first command address signal is sampled by the first sampling circuit 104 using the PCLK_E signal, to obtain a second address even signal (represented by CA[13:0]_1T_E), and the second address even signal includes a to-be-processed instruction even signal (represented by CA[4:0]_1T_E). The first command address signal is sampled by the second sampling circuit 105 using the PCLK_O signal, to obtain a second address odd signal (represented by CA[13:0]_1T_O), and the second address odd signal includes a to-be-processed instruction odd signal (represented by CA[4:0]_1T_O). The first chip select signal is sampled and inverted by the third sampling circuit 106 using the PCLK_E signal, to obtain a to-be-processed chip select even signal (represented by PCS_E). The first chip select signal is sampled and inverted by the fourth sampling circuit 107 using the PCLK_O signal, to obtain a to-be-processed chip select odd signal (represented by PCS_O). Then, the PCS_E signal is sampled by the fifth sampling circuit 108 using the PCLK_O signal, to obtain a target chip select odd signal (represented by PCS_OD). The PCS_O signal is sampled by the sixth sampling circuit 109 using the PCLK_E signal, to obtain a target chip select even signal (represented by PCS_ED). Then, a logic operation is performed on the PCLK_E signal and the PCS_ED signal by the first buffer 110 and the first AND gate 111 to obtain a chip select clock even signal (represented by CS_CLK_E). A logic operation is performed on the PCLK_O signal and the PCS_OD signal by the second buffer 112 and the second AND gate 113 to obtain a chip select clock odd signal (represented by CS_CLK_O). Then the CA[4:0]_1T_E, CA[4:0]_1T_O, PCS_OD and PCS_ED are decoded and sampled by the instruction decoder 114 using the CS_CLK_E signal and the CS_CLK_O signal, to obtain an instruction even signal (represented by CMD_E) and an instruction odd signal (represented by CMD_O). Finally, an OR logic operation is performed on the CMD_E signal CMD_O signal by the OR gate 115 to obtain a target instruction signal (represented by CMD). In addition, it is also to be noted that the CA[13:0]_1T_E signal is not a signal, but represents a group of signals, namely CA[13]_1T_E-CA[0]_1T_E, and the CA[4:0]_1T_E signals are five signals CA[0]_1T_E, CA[1]_1T_E, CA[2]_1T_E, CA[3]_1T_E, CA[4]_1T_E in the CA[13:0]_1T_E signal. The CA[13:0]_1T_O signal is not a signal, but represents a group of signals, namely CA[13]_1T_O-CA[0]_1T_O, and the CA[4:0]_1T_O signals are five signals CA[0]_1T_O, CA[1]_1T_O, CA[2]_1T_O, CA[3]_1T_O, CA[4]_1T_O in the CA[13:0]_1T_O signal.

Figure 3:
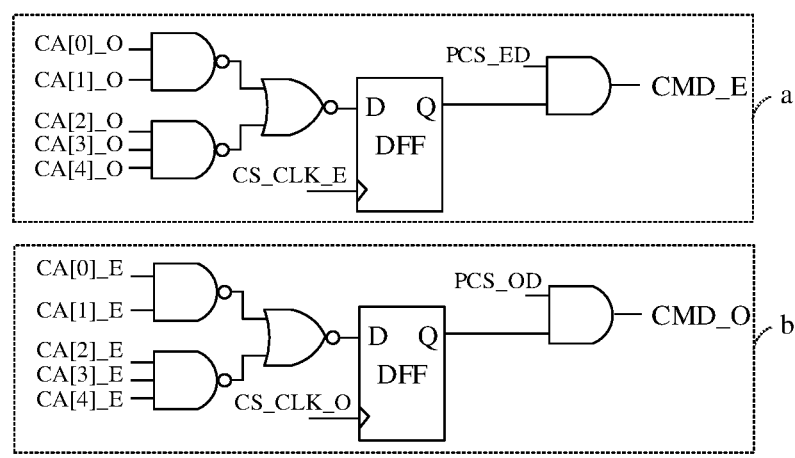
FIG. 3 is a schematic diagram of a composition structure of an instruction decoder.

It is also to be noted that, the instruction decoder 114 may also be called an instruction decoding flip-flop, which is represented by CMD DEC DFF. Referring to FIG. 3, the instruction decoder may include a first instruction decoding circuit a and a second instruction decoding circuit b. Both the first instruction decoding circuit a and the second instruction decoding circuit b are composed of logic components such as a two-input NAND gate, a three-input NAND gate, a two-input NOR gate, a D-type flip-flop, and an AND gate, as illustrated in FIG. 3 for details.

In this way, taking the DDR5 DRAM as an example, the initial clock signal (represented by CK_t/CK_c) is subjected to frequency division processing at the receiver into a PCLK_E signal and a PCLK_O signal, and then the CA signal is de-sampled. Because the 2T CMD in the DDR5 needs to use the CA signal of the first clock cycle as the instruction and address, and then use the CA signal of the second clock cycle as the remaining address. Therefore, the DDR5 design requires two-stages sampling, which then serve as addresses for two clock cycles, respectively. For instructions, it is necessary to perform combinational logic by using a CA signal at the first stage, and then perform the second stage sampling to align with the sampling address signal of the second cycle. Since the instruction signal needs to maintain a pulse width, the PCS_OD/ED signal obtained after two-stage sampling is subjected to an AND logic operation to generate the CMD_E/O signal, and then the CMD signal can be obtained after the OR operation.

Figure 4:
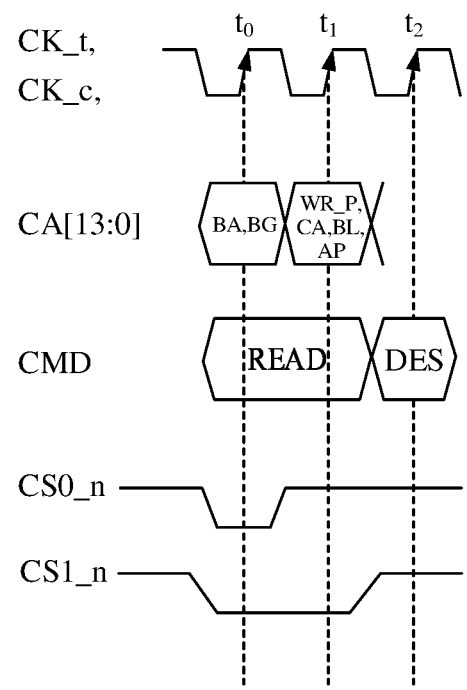
FIG. 4 is a schematic diagram of comparison of two chip select signals with different pulse widths.

However, there are two types of instruction signals in the DDR5: a 2T CMD signal and an NT ODT CMD signal. The 2T CMD signal may also be referred to as a 2-cycle Command signal. As illustrated in FIG. 4, for the 2T CMD signal, the corresponding chip select signal is represented by CS0_n, and its pulse width is the preset clock cycle. For the NT ODT CMD signal, the corresponding chip select signal is represented by CS1_n, and its pulse width is twice the preset clock cycle. The decoding sequences of these two types of signals are described below with reference to the signal sampling circuit 10.

Figure 5A:
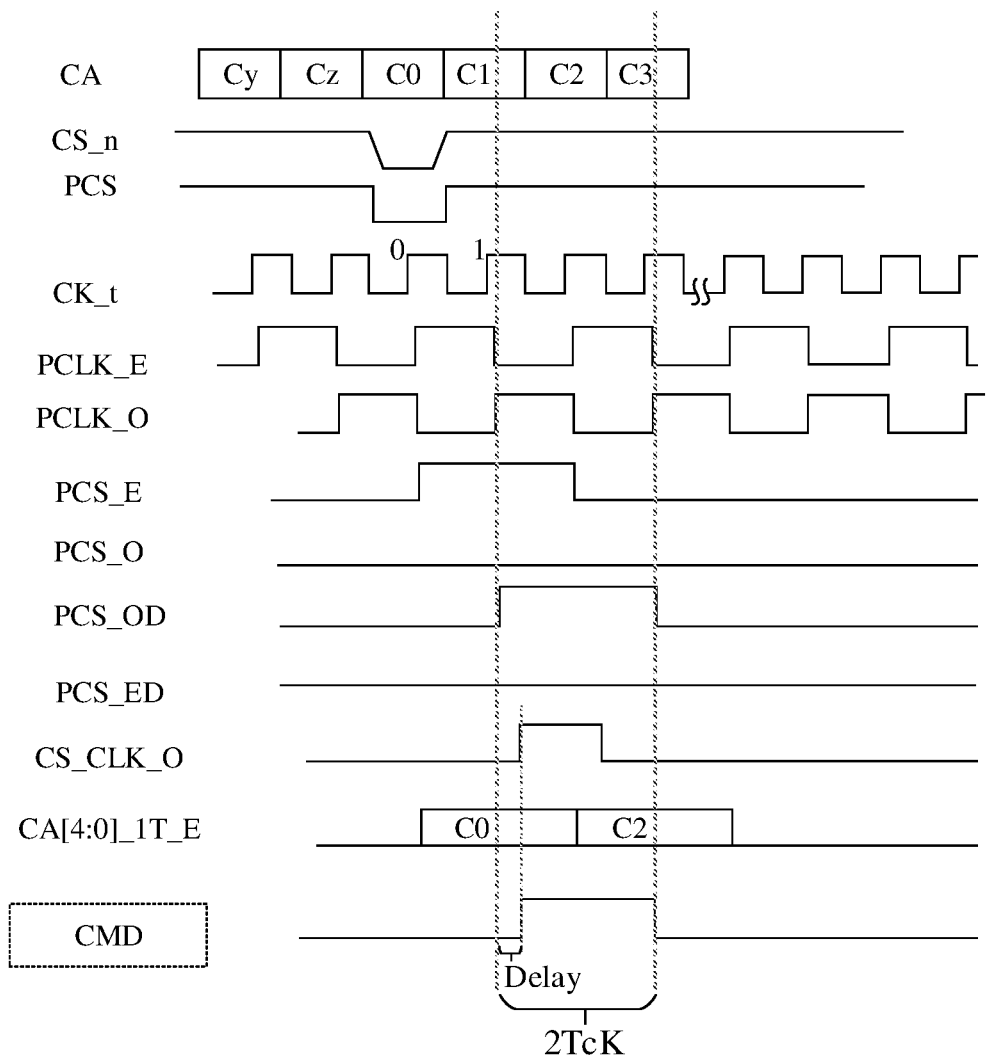
FIG. 5A is a schematic diagram of a signal timing sequence of a signal sampling circuit.
Figure 5B:
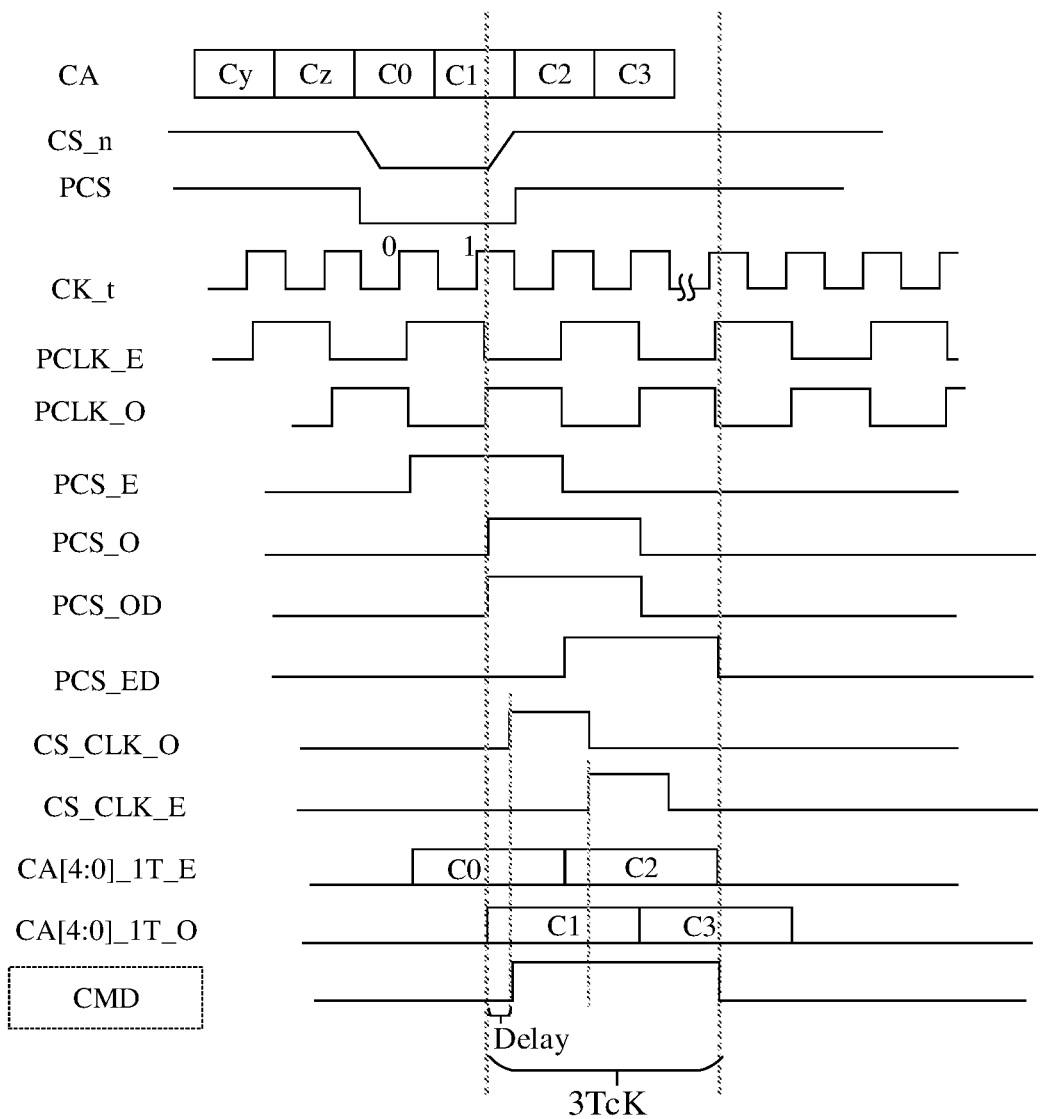
FIG. 5B is a schematic diagram of a signal timing sequence of another signal sampling circuit.

FIG. 5A and FIG. 5B illustrate the schematic diagrams of signal timing sequences corresponding to the signal sampling circuit 10 described above. As illustrated in FIG. 5A and FIG. 5B, the first command address signal is represented by CA, and CA may include Cy, Cz, C0, C1, C2 and C3. The initial chip select signal is represented by CS_n, and the first chip select signal is represented by PCS. The CS_n signal is a low-level valid pulse signal, and is configured to represent a signal indicating that the target chip is selected. The initial clock signal is represented by CK_t, the clock cycle of the CK_t signal is equal to the preset clock cycle, that is, 1Tck. The clock cycles of the PCLK_E signal and the PCLK_O signal are twice the preset clock cycle, that is, 2Tck.

For the 2T CMD signal, as illustrated in FIG. 5A, the pulse width of the PCS signal is the preset clock cycle at this time. After the PCS signal is sampled and inverted by using a rising edge of the PCLK_E signal, the obtained PCS_E signal is a high-level valid pulse signal, and the pulse width is twice the preset clock cycle. After the PCS signal is sampled and inverted by using a rising edge of the PCLK_O signal, the obtained PCS_O signal is a low-level signal. After the PCS_E signal is sampled by using the PCLK_O signal, the obtained PCS_OD signal is a high-level valid pulse signal, and the pulse width is twice the preset clock cycle. However, after the PCS_O signal is sampled by using the PCLK_E signal, the obtained PCS_ED signal is a low-level signal. After the logic operations of the first buffer 110, the first AND gate 111, the second buffer 112, and the second AND gate 113, etc., the obtained CS_CLK_E signal is a low-level signal, and the CS_CLK_O signal is a high-level valid pulse signal, and the pulse width is a preset clock cycle. Then, after the CA signal is sampled by using the rising edge of the PCLK_E signal, the obtained CA[4:0]_1T_E signal includes C0 and C2. Because the CS_CLK_E signal and the PCS_ED signal are low-level signals, then the decoded CMD_E signal is also a low-level signal. Only after the sampling and decoding processing is performed by using the CS_CLK_O signal, the PCS_OD signal and the CA[4:0]_1T_E signal, the obtained CMD_O signal is the CMD signal, and the CMD signal is a high-level valid pulse signal, and the pulse width is a difference between twice the preset clock cycle and a delay. The delay refers to a delay between the rising edge of the CS_CLK_O signal and the rising edge of the PCS_OD signal, that is, the pulse width of the CMD signal=(2Tck-delay).

For the NT ODT CMD signal, as illustrated in FIG. 5B, at this time, the pulse width of the PCS signal is twice the preset clock cycle. After the PCS signal is sampled and inverted by using the rising edge of the PCLK_E/PCLK_O signal, the obtained PCS_E/PCS_O signal is a high-level valid pulse signal, and the pulse width is twice the preset clock cycle. However, the PCS_O signal is delayed by a preset clock cycle compared with the PCS_E signal. The PCS_OD/PCS_ED signal obtained after further sampling processing is also a high-level valid pulse signal, and the pulse width is twice the preset clock cycle. However, the PCS_ED signal is delayed by a preset clock cycle compared with the PCS_OD signal. Then, the CS_CLK_O/CS_CLK_E signals obtained through the logic operation is also a high-level valid pulse signal, and the pulse width is a preset clock cycle. However, the CS_CLK_E signal is delayed by a preset clock cycle compared with the CS_CLK_O signal. The CA[4:0]_1T_E signal includes C0 and C2, and the CA[4:0]_1T_O signal includes C1 and C3. At this time, not only the C0 sampled by the CS_CLK_O signal needs to be decoded, but also the C1 sampled by the CS_CLK_E signal needs to be decoded, so that the pulse width of the finally generated CMD signal is a difference between three times the preset clock cycle and the delay, namely, the pulse width of the CMD signal=(3Tck-delay). Moreover, there are decoding information of C0 and decoding information of C1 in the CMD signal, so the NT ODT CMD signal is not correctly decoded.

That is, a pulsed CMD signal can be generated by performing instruction sampling through CS_CLK_O/CS_CLK_E signal which is generated by applying a simple PCS_ED/PCS_OD and PCLK_E/PCLK_O combinational logic, and then performing an AND operation with PCS_ED/PCS_OD. However, the difference between the 2T CMD signal and the NT ODT CMD signal is that the pulse widths of the CS_n signal at a low level are different. If the foregoing signal sampling circuit 10 is directly used, the NT ODT CMD signal may be erroneously parsed into a 2T CMD signal. However, the operational functions of these two types of command signals are different. Therefore, in practical applications, the 2T CMD signal and the NT ODT CMD signal need to be distinguished and decoded correctly.

On this basis, embodiments of the disclosure provide a signal sampling circuit. The signal sampling circuit includes: a signal input circuit, a first instruction sampling circuit, a second instruction sampling circuit, and an instruction decoding circuit. The signal input circuit is configured to determine a to-be-processed instruction signal and a to-be-processed chip select signal according to a first clock signal, a first chip select signal, and a first command address signal. A clock cycle of the first clock signal is twice a preset clock cycle. The first instruction sampling circuit is configured to perform, responsive to a pulse width of the first chip select signal being the preset clock cycle, two-stage sampling and logic operation processing on the to-be-processed chip select signal according to the first clock signal to obtain a first chip select clock signal. The second instruction sampling circuit is configured to perform, responsive to the pulse width of the first chip select signal being twice the preset clock cycle, two-stage sampling and logic operation processing on the to-be-processed chip select signal according to the first clock signal to obtain a second chip select clock signal. The instruction decoding circuit is configured to perform decoding and sampling processing on the to-be-processed instruction signal according to be to-be-processed chip select signal and the first chip select clock signal to obtain a target instruction signal, or perform decoding and sampling processing on the to-be-processed instruction signal according to the to-be-processed chip select signal and the second chip select clock signal to obtain a target instruction signal. In this way, based on the signal sampling circuit, in a case that the pulse widths of the first chip select signals are different, two types of instructions, i.e., 2T CMD and NT ODT CMD, can be correctly distinguished according to the obtained first chip select clock signal and second chip select clock signal, and decoded accurately without affecting each other, thereby avoiding the problem of an incorrect operation caused by an instruction decoding error.

The embodiments of the disclosure are described in detail below in conjunction with the drawings.

Figure 6:
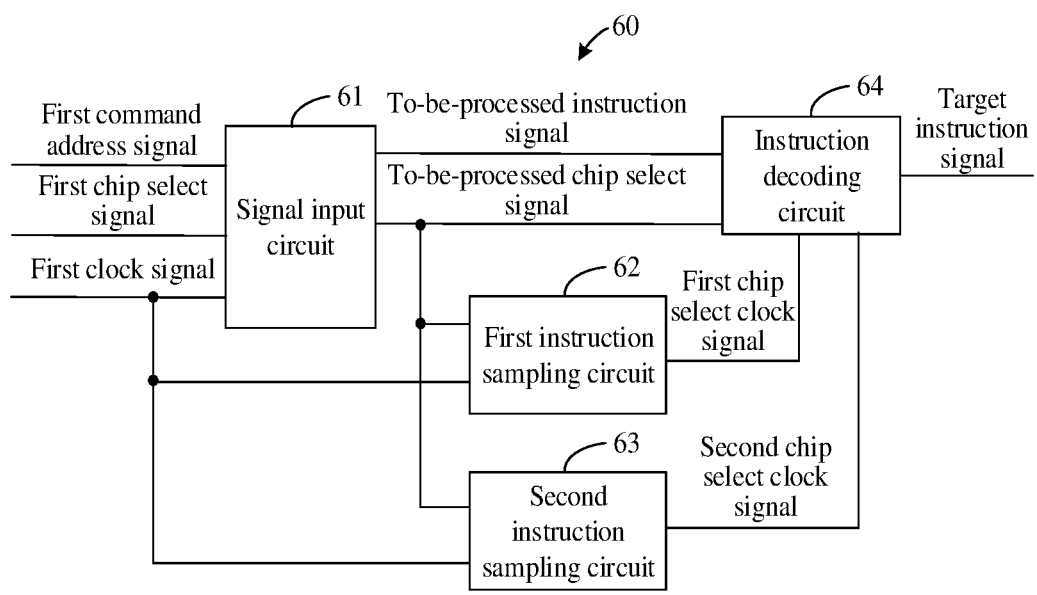
FIG. 6 is a schematic diagram of a composition structure of a signal sampling circuit according to an embodiment of the disclosure.

In an embodiment of the disclosure, FIG. 6 illustrates a schematic diagram of a composition structure of a signal sampling circuit according to the embodiment of the disclosure. As illustrated in FIG. 6, the signal sampling circuit 60 may include a signal input circuit 61, a first instruction sampling circuit 62, a second instruction sampling circuit 63, and an instruction decoding circuit 64.

The signal input circuit 61 is configured to determine a to-be-processed instruction signal and a to-be-processed chip select signal according to a first clock signal, a first chip select signal, and a first command address signal, here a clock cycle of the first clock signal is twice a preset clock cycle.

The first instruction sampling circuit 62 is configured to perform, responsive to a pulse width of the first chip select signal being the preset clock cycle, two-stage sampling and logic operation processing on the to-be-processed chip select signal according to the first clock signal, to obtain a first chip select clock signal.

The second instruction sampling circuit 63 is configured to perform, responsive to the pulse width of the first chip select signal being twice the preset clock cycle, two-stage sampling and logic operation processing on the to-be-processed chip select signal according to the first clock signal, to obtain a second chip select clock signal.

The instruction decoding circuit 64 is configured to perform decoding and sampling processing on the to-be-processed instruction signal according to the to-be-processed chip select signal and the first chip select clock signal to obtain a target instruction signal, or perform decoding and sampling processing on the to-be-processed instruction signal according to the to-be-processed chip select signal and the second chip select clock signal to obtain a target instruction signal.

It is to be noted that, in the embodiment of the disclosure, the signal sampling circuit 60 is applied to the sampling and decoding process of the address and instruction signals, and may be specifically applied to various circuit scenarios. In the embodiment of the disclosure, the sampling and decoding of addresses and instructions performed by the CA signal in the DRAM chip are used for explanation and description in the following, but does not constitute a relevant limitation.

It is also to be noted that, in the embodiment of the disclosure, the signal sampling circuit 60 may be applied to the 2T CMD scenario. Specifically, in this scenario, the first command address signal here includes valid signals of two preset clock cycles, and a valid pulse of the target instruction signal (represented by CMD) also lasts for two preset clock cycles. For details, see FIG. 1. In FIG. 1, the CS_n signal is a low-level valid pulse signal, and the CA[13:0] signals corresponding to the current clock cycle and an adjacent next clock cycle are both valid. The current clock cycle is a clock cycle corresponding to that the CS_n signal is a low-level pulse. In addition, it is to be noted that the preset clock cycle here refers to a clock cycle of the CK_t/CK_c signal, the CS_n signal is a signal representing that the target chip is selected, and CA[13:0] is not a signal, but represents a group of command address signals, namely CA[0]-CA[13], a total of 14 signals.

It is also to be noted that, in the embodiment of the disclosure, the target instruction signal may be a Command signal in the DDR5 DRAM chip. Since the valid pulse of the signal lasts for two clock cycles, it may be referred to as the 2T CMD signal here. The Command signal may include a read command signal, a write command signal, a refresh command signal, a precharge command signal, an active command signal, etc. Alternatively, the target instruction signal may also be a Non-Target ODT Command signal in the DDR5 DRAM chip, which may be referred to as the NT ODT CMD signal here.

In the sampling and decoding of instructions, in order to solve the problem of distinguishing the sampling and decoding of the 2T CMD signal and the NT ODT CMD signal, the embodiment of the disclosure adds a first instruction sampling circuit 62 and a second instruction sampling circuit 63. Since the pulse widths of the first chip select signals used by the two instruction sampling circuits are different, different first chip select clock signal and second chip select clock signal may be output. In this way, for the 2T CMD signal, the target instruction signal obtained by using the first chip select clock signal is a valid signal, and the target instruction signal obtained by using the second chip select clock signal is an invalid signal (i.e., a low-level signal). For the NT ODT CMD signal, the target instruction signal obtained by using the first chip select clock signal is an invalid signal (i.e., a low-level signal), and the target instruction signal obtained by using the second chip select clock signal is a valid signal, so that the two types of instruction signals, i.e., 2T CMD and NT ODT CMD can be correctly distinguished and decoded accurately.

In some embodiments, for the target instruction signal, the target instruction signal includes one pulse, and a pulse width of the pulse is twice the preset clock cycle.

In a case that a pulse width of the first chip select signal is the preset clock cycle, the first chip select clock signal includes two pulses, and a pulse width of each pulse is the preset clock cycle, and the second chip select clock signal keeps a level state unchanged. A rising edge of the first pulse in the first chip select clock signal is configured to generate a rising edge of the target instruction signal, and a rising edge of the second pulse in the first chip select clock signal is configured to generate a falling edge of the target instruction signal.

That is, responsive to the pulse width of the first chip select signal is the preset clock cycle, the first chip select clock signal obtained according to the first instruction sampling circuit 62 is a valid signal, and the second chip select clock signal obtained according to the second instruction sampling circuit 63 is an invalid signal. In addition, in this case, the target instruction signal is a 2T CMD signal. Moreover, a rising edge of the target instruction signal is generated by the rising edge of the first pulse in the first chip select clock signal, and a falling edge of the target instruction signal is generated by the rising edge of the second pulse in the first chip select clock signal.

It is to be noted that, for the pulse width described in the embodiment of the disclosure, taking the target instruction signal as an example, "the pulse width is twice the preset clock cycle" specifically refers to the deviation between the pulse width and twice the preset clock cycle is within a preset precision range, and the description of the pulse width of other signals in the disclosure may also be understood by reference.

In some embodiments, for the target instruction signal, the target instruction signal includes one pulse, and a pulse width of the pulse is twice the preset clock cycle.

In a case that a pulse width of the first chip select signal is twice the preset clock cycle, the first chip select clock signal keeps a level state unchanged, and the second chip select clock signal includes two pulses, and a pulse width of each pulse is the preset clock cycle. A rising edge of the first pulse in the second chip select clock signal is configured to generate a rising edge of the target instruction signal, and a rising edge of the second pulse in the second chip select clock signal is configured to generate a falling edge of the target instruction signal.

That is, responsive to the pulse width of the first chip select signal is twice the preset clock cycle, the first chip select clock signal obtained according to the first instruction sampling circuit 62 is an invalid signal, and the second chip select clock signal obtained according to the second instruction sampling circuit 63 is a valid signal. In addition, in this case, the target instruction signal is a NT ODT CMD signal. Moreover, a rising edge of the target instruction signal is generated by the rising edge of the first pulse in the second chip select clock signal, and a falling edge of the target instruction signal is generated by the rising edge of the second pulse in the second chip select clock signal.

In this way, according to the first chip select clock signal and the second chip select clock signal, the two types of instruction signals, i.e., 2T CMD and NT ODT CMD, may be correctly distinguished and decoded accurately, and may be used for generating the rising edge and the falling edge of the target instruction signal, so that the pulse width of the target instruction signal is always twice the preset clock cycle within the preset precision range, avoiding the problem of uncertainty of the pulse width of the target instruction signal.

Figure 7:
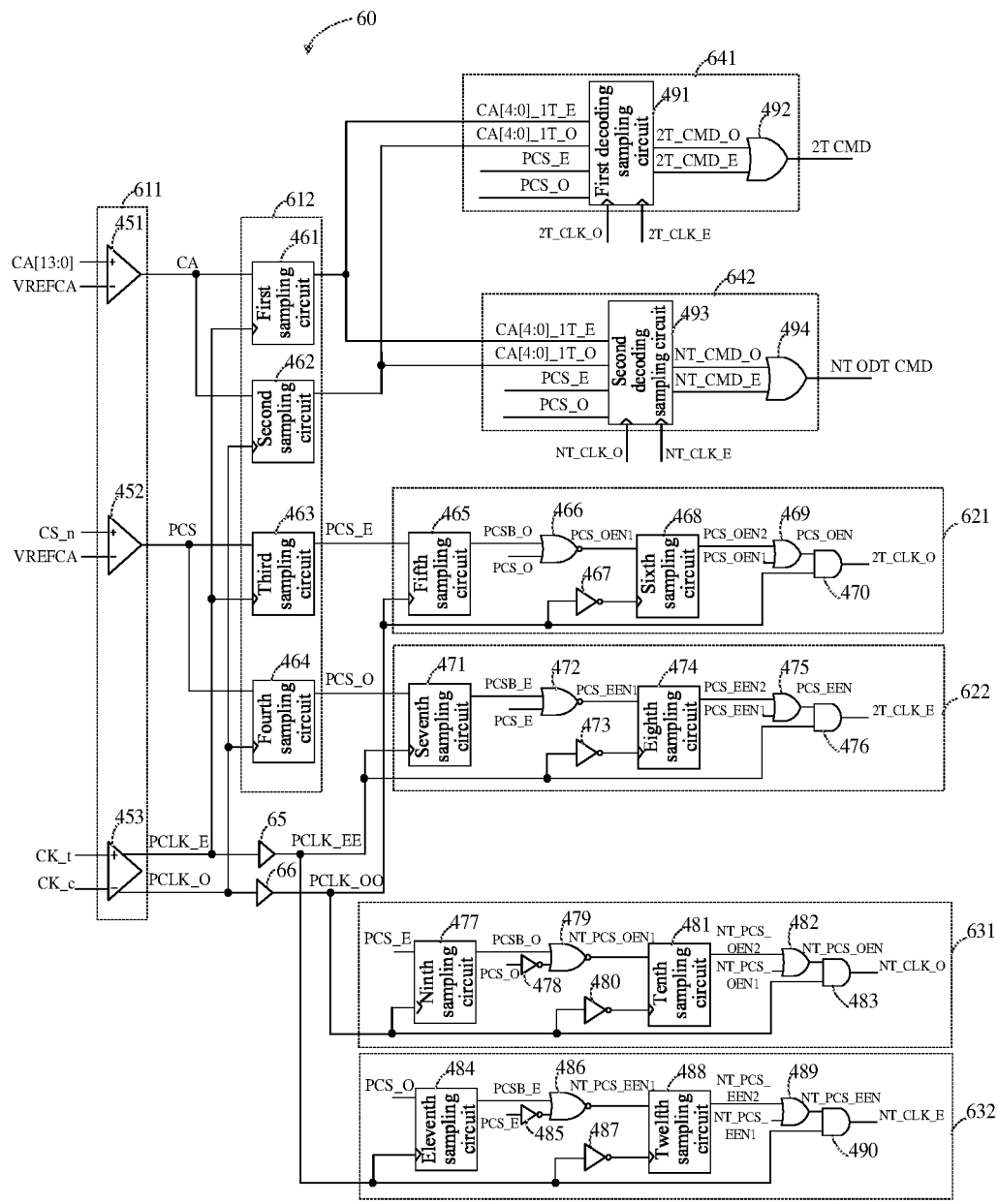
FIG. 7 is a schematic diagram of a composition structure of another signal sampling circuit according to an embodiment of the disclosure.

In some embodiments, based on the signal sampling circuit 60 illustrated in FIG. 6, as illustrated in FIG. 7, the signal input circuit 61 may include a receiving circuit 611 and an input sampling circuit 612.

The receiving circuit 611 is configured to receive an initial command address signal, an initial chip selects signal and an initial clock signal, and output the first command address signal, the first chip select signal and the first clock signal.

The input sampling circuit 612 is configured to perform sampling processing on the first chip select signal and the first command address signal according to the first clock signal to obtain the to-be-processed chip select signal and the to-be-processed instruction signal.

Here, a clock cycle of the initial clock signal is the preset clock cycle, and a clock cycle of the first clock signal is twice the preset clock cycle. That is, the first clock signal is obtained by performing frequency division processing on the initial clock signal.

In a specific embodiment, as illustrated in FIG. 7, the receiving circuit 611 may include a first receiving circuit 451, a second receiving circuit 452, and a third receiving circuit 453.

The first receiving circuit 451 is configured to receive the initial command address signal and output the first command address signal.

The second receiving circuit 452 is configured to receive the initial chip select signal and output the first chip select signal.

The third receiving circuit 453 is configured to receive the initial clock signal, perform frequency division processing on the initial clock signal, and output a first clock odd signal and a first clock even signal.

Here, the first clock signal may be composed of the first clock odd signal and the first clock even signal. Respective clock cycles of the first clock odd signal and the first clock even signal are twice the preset clock cycle, and a phase difference between the first clock odd signal and the first clock even signal is 180 degrees.

In addition, it is to be noted that, in the embodiment of the disclosure, the first receiving circuit 451 and the second receiving circuit 452 or the third receiving circuit 453 may be receivers (represented by Receiver), or may be buffers (represented by Buffer).

It is also to be noted that, in the embodiment of the disclosure, the initial command address signal here may be represented by CA[13:0], the first command address signal may be represented by CA, the initial chip select signal may be represented by CS_n, the first chip select signal may be represented by PCS, the initial clock signal may be represented by CK_t and CK_c, the first clock even signal may be represented by PCLK_E, and the first clock odd signal may be represented by PCLK_O. For the PCLK_E signal and the PCLK_O signal, the clock cycle of the PCLK_E signal is twice the preset clock cycle, the clock cycle of the PCLK_O signal is also twice the preset clock cycle, and the phase difference between the PCLK_E signal and the PCLK_O signal is 180 degrees.

It is also to be noted that, in the embodiment of the disclosure, the initial command address signal and the first command address signal are not a signal, but represent a group of command address signals, namely CA[0]-CA[13]. Therefore, for the first receiving circuit 451, 14 receiving circuits may be included here, which are respectively configured to receive 14 signals, i.e., CA[0], CA[1], . . . , CA[13]. Only one receiving circuit is illustrated for illustration.

Furthermore, for the input sampling circuit 612, the embodiment of the disclosure not only needs to use the first clock signal to sample the first command address signal, but also needs to use the first clock signal to sample the first chip select signal. Therefore, in some embodiments, as illustrated in FIG. 7, the input sampling circuit 612 may include a first sampling circuit 461, a second sampling circuit 462, a third sampling circuit 463, and a fourth sampling circuit 464.

The first sampling circuit 461 is configured to perform sampling processing on the first command address signal according to the first clock even signal, to obtain a to-be-processed instruction even signal.

The second sampling circuit 462 is configured to perform sampling processing on the first command address signal according to the first clock odd signal, to obtain a to-be-processed instruction odd signal.

The third sampling circuit 463 is configured to perform sampling and inverting processing on the first chip select signal according to the first clock even signal, to obtain a to-be-processed chip select even signal.

The fourth sampling circuit 464 is configured to perform sampling and inverting processing on the first chip select signal according to the first clock odd signal, to obtain a to-be-processed chip select odd signal.

Here, the to-be-processed instruction signal is composed of the to-be-processed instruction even signal and the to-be-processed instruction odd signal, and the to-be-processed chip select signal is composed of a to-be-processed chip select even signal and a to-be-processed chip select odd signal.

It is to be noted that, in a specific embodiment, the first sampling circuit 461 may include a first flip-flop. An input terminal of the first flip-flop is inputted with the first command address signal, a clock terminal of the first flip-flop is inputted with the first clock even signal, and an output terminal of the first flip-flop is configured to output the to-be-processed instruction even signal. The second sampling circuit 462 may include a second flip-flop. An input terminal of the second flip-flop is inputted with the first command address signal, a clock terminal of the second flip-flop is inputted with the first clock odd signal, and an output terminal of the second flip-flop is configured to output the to-be-processed instruction odd signal. The third sampling circuit 463 may include a third flip-flop and a first inverter. An input terminal of the third flip-flop is inputted with the first chip select signal, a clock terminal of the third flip-flop is inputted with the first clock even signal, an output terminal of the third flip-flop is connected with an input terminal of the first inverter, and an output terminal of the first inverter is configured to output the to-be-processed chip select even signal. The fourth sampling circuit 464 may include a fourth flip-flop and a second inverter. An input terminal of the fourth flip-flop is inputted with the first chip select signal, a clock terminal of the fourth flip-flop is inputted with the first clock odd signal, an output terminal of the fourth flip-flop is connected with an input terminal of the second inverter, and an output terminal of the second inverter is configured to output the to-be-processed chip select odd signal.

For the first sampling circuit 461 and the second sampling circuit 462, the to-be-processed command address signal may be composed of the to-be-processed command address even signal and the to-be-processed command address odd signal, and the to-be-processed instruction signal may be composed of a to-be-processed instruction even signal and a to-be-processed instruction odd signal. The to-be-processed command address even signal includes a to-be-processed instruction even signal. The to-be-processed command address even signal is represented by CA[13:0]_1T_E, and the to-be-processed instruction even signal is represented by CA[4:0]_1T_E. The to-be-processed command address odd signal includes a to-be-processed instruction odd signal. The to-be-processed command address odd signal is represented by CA[13:0]_1T_O, and the to-be-processed instruction odd signal is represented by CA[4:0]_1T_O. Here, it is to be noted that CA[13:0]_1T_E is not a signal, but represents a group of command address signals, namely CA[0]_1T_E-CA[13]_1T_E, while CA[4:0]_1T_E represents five signals, namely CA[0]_1T_E-CA[4]_1T_E in this group of signals. CA[13:0]_1T_O is not a signal, but represents a group of command address signals, namely CA[0]_1T_O-CA[13]_1T_O, while CA[4:0]_1T_O represents five signals, namely CA[0]_1T_O-CA[4]_1T_O in this group of signals.

For the third sampling circuit 463 and the fourth sampling circuit 464, the to-be-processed chip select signal may be composed of a to-be-processed chip select even signal and a to-be-processed chip select odd signal. The first chip select signal is represented by PCS, the to-be-processed chip select even signal is represented by PCS_E, and the to-be-processed chip select odd signal is represented by PCS_O.

It is also to be noted that, in the embodiment of the disclosure, because PCS is a low-level valid pulse signal, for the third sampling circuit 463 and the fourth sampling circuit 464, after the first inverter or the second inverter is added, the PCS_O signal or the PCS_E signal may become a high-level valid pulse signal for subsequent logic operations. However, for subsequent different logic operations, the third sampling circuit 463 and the fourth sampling circuit 464 do not need to set the first inverter and the second inverter, then the subsequent logic operations need to be adjusted accordingly, so that the same effect can be achieved.

In some embodiments, the first flip-flop, the second flip-flop, the third flip-flop, and the fourth flip-flop may be D-type flip-flops. Taking the first sampling circuit 461 and the second sampling circuit 462 as an example, in the first sampling circuit 461, a clock terminal of the D-type flip-flop is inputted with the PCLK_E signal, an input terminal of the D-type flip-flop is inputted with the CA signal, and an output terminal of the D-type flip-flop is configured to output the CA[13:0]_1T_E signal, and the CA[4:0]_1T_E signal constitutes the to-be-processed instruction even signal. In the second sampling circuit 462, the clock terminal of the D-type flip-flop is inputted with the PCLK_O signal, the input terminal of the D-type flip-flop is inputted with the CA signal, and the output terminal of the D-type flip-flop is configured to output the CA[13:0]_1T_O signal, and the CA[4:0]_1T_O signal constitutes the to-be-processed instruction odd signal. Here, it is to be noted that, for the first sampling circuit 461 or the second sampling circuit 462, since CA is not a signal, but a general term for a group of signals, a plurality of first sampling circuits 461 may be included here, respectively configured to receive each CA signal in this group of CA signals. Similarly, a plurality of second sampling circuits 462 may also be included, respectively configured to receive each CA signal in this group of CA signals. Only one first sampling circuit 461 and one second sampling circuit 462 are illustrated for illustration.

In this way, after passing through the receiving circuit 611 and the input sampling circuit 612, the PCLK_E signal, the PCLK_O signal, the PCS_E signal, the PCS_O signal, the CA[4:0]_1T_E signal and the CA[4:0]_1T_O signal may be obtained. Furthermore, different first chip select clock signal and second chip select clock signal may be obtained by using the first chip select signals with different pulse widths and different command sampling circuits (the first command sampling circuit 62 and the second command sampling circuit 63), so that the two types of instructions, i.e., 2T CMD and NT ODT CMD, may be correctly distinguished and decoded accurately, without affecting each other.

In some embodiments, based on the signal sampling circuit 60 illustrated in FIG. 6, as illustrated in FIG. 7, the signal sampling circuit 60 may further include a first buffer 65 and a second buffer 66.

The first buffer 65 is configured to perform delay processing on the first clock even signal to obtain a first clock delay even signal.

The second buffer 66 is configured to perform delay processing on the first clock odd signal to obtain a first clock delay odd signal.

It is to be noted that, in the embodiment of the disclosure, before the first clock even signal and the first clock odd signal are inputted to the first command sampling circuit 62 and the second command sampling circuit 63, delay processing is required. Here, the first clock even signal is represented by PCLK_E, the first clock delay even signal is represented by PCLK_EE, the first clock odd signal is represented by PCLK_O, and the first clock delay odd signal is represented by PCLK_OO.

It is also to be noted that, for the buffer, both the first buffer 65 and the second buffer 66 have a delay function, and also have the function of enhancing the signal driving capability. Specifically, for the first clock delay even signal and the first clock even signal, the first clock delay even signal not only has a delay compared with the first clock even signal, but also the driving ability of the first clock delay even signal is stronger. Similarly, for the first clock delay odd signal and the first clock odd signal, the first clock delay odd signal has a delay compared with the first clock odd signal, and the driving ability of the first clock delay odd signal is stronger.

In the embodiment of the disclosure, for the first buffer 65 or the second buffer 66, the number of buffers is not limited to one, and may also be multiple. Here, the specific number may be set according to actual needs, and is not specifically limited.

In some embodiments, based on the signal sampling circuit 60 illustrated in FIG. 6, as illustrated in FIG. 7, the first instruction sampling circuit 62 may include a first logic circuit 621 and a second logic circuit 622.

The first logic circuit 621 is configured to receive the first clock delay odd signal and the to-be-processed chip select even signal, and perform a two-stage sampling and logic operation on the to-be-processed chip select even signal by using the first clock delay odd signal, to obtain a first chip select clock odd signal.

The second logic circuit 622 is configured to receive the first clock delay even signal and the to-be-processed chip select odd signal, and perform a two-stage sampling and logic operation on the to-be-processed chip select odd signal by using the first clock delay even signal, to obtain a first chip select clock even signal.

Here, the first chip select clock signal is composed of the first chip select clock even signal and the first chip select clock odd signal. The first chip select clock even signal may be represented by 2T_CLK_E, and the first chip select clock odd signal may be represented by 2T_CLK_O.

In a specific embodiment, as illustrated in FIG. 7, the first logic circuit 621 may include a fifth sampling circuit 465, a first NOR gate 466, a first NOT gate 467, a sixth sampling circuit 468, a first OR gate 469, and a first AND gate 470.

The fifth sampling circuit 465 is configured to perform sampling and inverting processing on the to-be-processed chip select even signal by using the first clock delay odd signal, to obtain a first intermediate sampling odd signal.

The first NOR gate 466 is configured to perform a NOR operation on the first intermediate sampling odd signal and the to-be-processed chip select odd signal to obtain a second intermediate sampling odd signal.

The first NOT gate 467 is configured to perform a NOT operation on the first clock delay odd signal to obtain a first inverted clock odd signal.

The sixth sampling circuit 468 is configured to perform sampling processing on the second intermediate sampling odd signal by using the first inverted clock odd signal, to obtain a third intermediate sampling odd signal.

The first OR gate 469 is configured to perform an OR operation on the second intermediate sampling odd signal and the third intermediate sampling odd signal to obtain a fourth intermediate sampling odd signal.

The first AND gate 470 is configured to perform an AND operation on the fourth intermediate sampling odd signal and the first clock delay odd signal to obtain the first chip select clock odd signal.

It is to be noted that, in the first logic circuit 621, the fifth sampling circuit 465 may be composed of a fifth flip-flop and a third inverter, and the sixth sampling circuit 468 may be composed of a sixth flip-flop. The fifth flip-flop and the sixth flip-flop may be D-type flip-flops. In addition, it is also to be noted that, for the fifth sampling circuit 465, the third inverter may not be provided. The subsequent logic operation needs to be adjusted correspondingly. For example, the first NOR gate 466 is adjusted to an OR gate, so that the same effect may also be achieved.

Specifically, in FIG. 7, an input terminal of the fifth flip-flop is inputted with the to-be-processed chip select even signal, a clock terminal of the fifth flip-flop is inputted with the first clock delay odd signal, an output terminal of the fifth flip-flop is inputted with an input terminal of the third inverter, and an output terminal of the third inverter is configured to output the first intermediate sampling odd signal. One input terminal of the first NOR gate 466 is inputted with the output terminal of the third inverter, another input terminal of the first NOR gate 466 is configured to receive the to-be-processed chip select odd signal, an output terminal of the first NOR gate 466 is configured to output the second intermediate sampling odd signal, the output terminal of the first NOR gate 466 is inputted with an input terminal of the sixth flip-flop, a clock terminal of the sixth flip-flop is inputted with an output terminal of the first NOT gate 467, and an input terminal of the first NOT gate 467 is configured to receive the first clock delay odd signal. An output terminal of the sixth flip-flop is configured to output the third intermediate sampling odd signal, the output terminal of the sixth flip-flop is inputted with one input terminal of the first OR gate 469, another input terminal of the first OR gate 469 is configured to receive the second intermediate sampling odd signal, an output terminal of the first OR gate 469 is configured to output the fourth intermediate sampling odd signal, and the output terminal of the first OR gate 469 is inputted with one input terminal of the first AND gate 470, another input terminal of the first AND gate 470 is configured to receive the first clock delay odd signal, and an output terminal of the first AND gate 470 is configured to output the first chip select clock odd signal.

It is also to be noted that, in the embodiment of the disclosure, the to-be-processed chip select even signal is represented by PCS_E, the first intermediate sampling odd signal outputted by the fifth sampling circuit 465 may be represented by PCSB_O, and the second intermediate sampling odd signal outputted by the first NOR gate 466 may be represented by PCS_OEN1, the third intermediate sampling odd signal outputted by the sixth sampling circuit 468 may be represented by PCS_OEN2, and the fourth intermediate sampling odd signal outputted by the first OR gate 469 may be represented by PCS_OEN, and the first chip select clock odd signal outputted by the first AND gate 470 may be represented by 2T_CLK_O.

In another specific embodiment, as illustrated in FIG. 7, the second logic circuit 622 may include a seventh sampling circuit 471, a second NOR gate 472, a second NOT gate 473, an eighth sampling circuit 474, a second OR gate 475, and a second AND gate 476.

The seventh sampling circuit 471 is configured to perform sampling and inverting processing on the to-be-processed chip select odd signal by using the first clock delay even signal, to obtain a first intermediate sampling even signal.

The second NOR gate 472 is configured to perform a NOR operation on the first intermediate sampling even signal and the to-be-processed chip select even signal to obtain a second intermediate sampling even signal.

The second NOT gate 473 is configured to perform a NOT operation on the first clock delay even signal to obtain a first inverted clock even signal.

The eighth sampling circuit 474 is configured to perform sampling processing on the second intermediate sampling even signal by using the first inverted clock even signal, to obtain a third intermediate sampling even signal.

The second OR gate 475 is configured to perform an OR operation on the second intermediate sampling even signal and the third intermediate sampling even signal to obtain a fourth intermediate sampling even signal.

The second AND gate 476 is configured to perform an AND operation on the fourth intermediate sampling even signal and the first clock delay even signal to obtain the first chip select clock even signal.

It is to be noted that, in the second logic circuit 622, the seventh sampling circuit 471 may be composed of a seventh flip-flop and a fourth inverter, and the eighth sampling circuit 474 may be composed of an eighth flip-flop. The seventh flip-flop and the eighth flip-flop may be D-type flip-flops. In addition, it is also to be noted that, for the seventh sampling circuit 471, the fourth inverter may not be provided. The subsequent logic operation needs to be adjusted correspondingly. For example, the second NOR gate 472 is adjusted to an OR gate, so that the same effect may also be achieved.

Specifically, in FIG. 7, an input terminal of the seventh flip-flop is inputted with the to-be-processed chip select odd signal, a clock terminal of the seventh flip-flop is inputted with the first clock delay even signal, an output terminal of the seventh flip-flop is inputted with an input terminal of the fourth inverter, and an output terminal of the fourth inverter is configured to output the first intermediate sampling even signal. One input terminal of the second NOR gate 472 is inputted with the output terminal of the fourth inverter, another input terminal of the second NOR gate 472 is configured to receive the to-be-processed chip select even signal, an output terminal of the second NOR gate 472 is configured to output the second intermediate sampling even signal, the output terminal of the second NOR gate 472 is inputted with an input terminal of the eighth flip-flop, a clock terminal of the eighth flip-flop is inputted with an output terminal of the second NOT gate 473, and an input terminal of the second NOT gate 473 is configured to receive the first clock delay even signal. An output terminal of the eighth flip-flop is configured to output the third intermediate sampling even signal, the output terminal of the eighth flip-flop is inputted with one input terminal of the second OR gate 475, another input terminal of the second OR gate 475 is configured to receive the second intermediate sampling even signal, an output terminal of the second OR gate 475 is configured to output the fourth intermediate sampling even signal, and the output terminal of the second OR gate 475 is inputted with one input terminal of the second AND gate 476, another input terminal of the second AND gate 476 is configured to receive the first clock delay even signal, and an output terminal of the second AND gate 476 is configured to output the first chip select clock even signal.

It is also to be noted that, in the embodiment of the disclosure, the to-be-processed chip select odd signal is represented by PCS_O, the first intermediate sampling even signal outputted by the seventh sampling circuit 471 may be represented by PCSB_E, and the second intermediate sampling even signal outputted by the second NOR gate 472 may be represented by PCS_EEN1, the third intermediate sampling even signal outputted by the eighth sampling circuit 474 may be represented by PCS_EEN2, and the fourth intermediate sampling even signal outputted by the second OR gate 475 may be represented by PCS_EEN, and the first chip select clock even signal outputted by the second AND gate 476 may be represented by 2T_CLK_E.

It is to be understood that for the first logic circuit 621, the fifth sampling circuit 465 may be regarded as a rising edge sampling circuit, that is, sampling processing is performed by using the rising edge of the first clock delay odd signal. The first NOT gate 467 and the sixth sampling circuit 468 may be regarded as a falling edge sampling circuit, that is, sampling processing is performed by using the falling edge of the first clock delay odd signal. For the second logic circuit 622, the seventh sampling circuit 471 may be regarded as a rising edge sampling circuit, that is, sampling processing is performed by using the rising edge of the first clock delay even signal. The second NOT gate 473 and the eighth sampling circuit 474 may be regarded as a falling edge sampling circuit, that is, sampling processing is performed by using the falling edge of the first clock delay even signal. That is, in the embodiment of the disclosure, the PCS_E/PCS_O signal is continuously sampled by a first-stage rising edge sampling circuit and a first-stage falling edge sampling circuit, and then the high-level pulse width of the chip select signal is increased by OR logic, thereby generating 2T_CLK_O/2T_CLK_E signal with two pulses.

Specifically, in the embodiment of the disclosure, the first OR gate 469 and the second OR gate 475 both have the function of widening the pulse width of the signal. Taking the first OR gate 469 as an example, the pulse width of the PCS_OEN1 signal is twice the preset clock cycle, and the pulse width of the PCS_OEN2 signal is also twice the preset clock cycle, but is delayed by a preset clock cycle compared with the PCS_OEN1 signal. In this way, an OR operation is performed on the PCS_OEN1 signal and the PCS_OEN2 signal by the first OR gate 469, to obtain the PCS_OEN signal, and the pulse width is three times the preset clock cycle. An AND operation is performed on the PCS_OEN signal and the PCLK_OO signal by the first AND gate 470, to obtain a 2T_CLK_O signal with two pulses, and the pulse width of each pulse is a preset clock cycle. Similarly, the pulse width of the PCS_EEN signal outputted by the second OR gate 475 is also three times the preset clock cycle. An AND operation is performed on the PCS_EEN signal and the PCLK_EE signal by the second AND gate 476 to obtain a 2T_CLK_E signal with two pulses, and the pulse width of each pulse is a preset clock cycle.

In this way, responsive to the pulse width of the first chip select signal being the preset clock cycle, two-stage sampling and logic operation processing is performed on the PCS_E signal by the first logic circuit 621 to obtain the 2T_CLK_O signal. Two-stage sampling and logic operation processing is performed on the PCS_O signal by the second logic circuit 622 to obtain the 2T_CLK_E signal. According to the 2T_CLK_O signal and the 2T_CLK_E signal, the target instruction signal that may be decoded is the 2T CMD signal.

In some embodiments, based on the signal sampling circuit 60 illustrated in FIG. 6, as illustrated in FIG. 7, the second instruction sampling circuit 63 may include a third logic circuit 631 and a fourth logic circuit 632.

The third logic circuit 631 is configured to receive the first clock delay odd signal and the to-be-processed chip select even signal, and perform a two-stage sampling and logic operation on the to-be-processed chip select even signal by using the first clock delay odd signal, to obtain a second chip select clock odd signal.

The fourth logic circuit 632 is configured to receive the first clock delay even signal and the to-be-processed chip select odd signal, and perform a two-stage sampling and logic operation on the to-be-processed chip select odd signal by using the first clock delay even signal, to obtain a second chip select clock even signal.

Here, the second chip select clock signal may be composed of the second chip select clock even signal and the second chip select clock odd signal. The second chip select clock even signal may be represented by NT_CLK_E, and the second chip select clock odd signal may be represented by NT_CLK_O.

In a specific embodiment, as illustrated in FIG. 7, the third logic circuit 631 may include a ninth sampling circuit 477, a third NOT gate 478, a third NOR gate 479, a fourth NOT gate 480, a tenth sampling circuit 481, a third OR gate 482, and a third AND gate 483.

The ninth sampling circuit 477 is configured to perform sampling and inverting processing on the to-be-processed chip select even signal by using the first clock delay odd signal, to obtain a fifth intermediate sampling odd signal.

The third NOT gate 478 is configured to perform a NOT operation on the to-be-processed chip select odd signal to obtain a second chip select inverted odd signal.

The third NOR gate 479 is configured to perform a NOR operation on the fifth intermediate sampling odd signal and the second chip select inverted odd signal to obtain a sixth intermediate sampling odd signal.

The fourth NOT gate 480 is configured to perform a NOT operation on the first clock delay odd signal to obtain a second inverted clock odd signal.

The tenth sampling circuit 481 is configured to perform sampling processing on the sixth intermediate sampling odd signal by using the second inverted clock odd signal, to obtain a seventh intermediate sampling odd signal.

The third OR gate 482 is configured to perform an OR operation on the sixth intermediate sampling odd signal and the seventh intermediate sampling odd signal to obtain an eighth intermediate sampling odd signal.

The third AND gate 483 is configured to perform an AND operation on the eighth intermediate sampling odd signal and the first clock delay odd signal to obtain the second chip select clock odd signal.

It is to be noted that, in the third logic circuit 631, the ninth sampling circuit 477 may be composed of a ninth flip-flop and a fifth inverter, and the tenth sampling circuit 481 may be composed of a tenth flip-flop. The ninth flip-flop and the tenth flip-flop may be D-type flip-flops. In addition, it is also to be noted that, for the ninth sampling circuit 477, the fifth inverter may not be provided. The subsequent logic operation needs to be adjusted correspondingly. For example, the third NOT gate 478 is removed, and the third NOR gate 479 is adjusted to an OR gate, so that the same effect may also be achieved.

Specifically, in FIG. 7, an input terminal of the ninth flip-flop is inputted with the to-be-processed chip select even signal, a clock terminal of the ninth flip-flop is inputted with the first clock delay odd signal, an output terminal of the ninth flip-flop is inputted with an input terminal of the fifth inverter, and an output terminal of the fifth inverter is configured to output the fifth intermediate sampling odd signal. One input terminal of the third NOR gate 479 is inputted with the output terminal of the fifth inverter, another input terminal of the third NOR gate 479 is inputted with an output terminal of the third NOT gate 478, an input terminal of the third NOT gate 478 is configured to receive the to-be-processed chip select odd signal, an output terminal of the third NOR gate 479 is configured to output the sixth intermediate sampling odd signal, and an output terminal of the third NOR gate 479 is inputted with an input terminal of the tenth flip-flop. A clock terminal of the tenth flip-flop is inputted with an output terminal of the fourth NOT gate 480, and an input terminal of the fourth NOT gate 480 is configured to receive the first clock delay odd signal. An output terminal of the tenth flip-flop is configured to output the seventh intermediate sampling odd signal, the output terminal of the tenth flip-flop is inputted with one input terminal of the third OR gate 482, another input terminal of the third OR gate 482 is configured to receive the sixth intermediate sampling odd signal, an output terminal of the third OR gate 482 is configured to output the eighth intermediate sampling odd signal, and the output terminal of the third OR gate 482 is inputted with one input terminal of the third AND gate 483, another input terminal of the third AND gate 483 is configured to receive the first clock delay odd signal, and an output terminal of the third AND gate 483 is configured to output the second chip select clock odd signal.

It is also to be noted that, in the embodiment of the disclosure, the to-be-processed chip select even signal is represented by PCS_E, the fifth intermediate sampling odd signal outputted by the ninth sampling circuit 477 may be represented by PCSB_O, and the sixth intermediate sampling odd signal outputted by the third NOR gate 479 may be represented by NT_PCS_OEN1, the seventh intermediate sampling odd signal outputted by the tenth sampling circuit 481 may be represented by NT_PCS_OEN2, the eighth intermediate sampling odd signal outputted by the third OR gate 482 may be represented by NT_PCS_OEN, and the second chip select clock odd signal outputted by the third AND gate 483 may be represented by NT_CLK_O.

In another specific embodiment, as illustrated in FIG. 7, the fourth logic circuit 632 may include an eleventh sampling circuit 484, a fifth NOT gate 485, a fourth NOR gate 486, a sixth NOT gate 487, a twelfth sampling circuit 488, a fourth OR gate 489, and a fourth AND gate 490.

The eleventh sampling circuit 484 is configured to perform sampling and inverting processing on the to-be-processed chip select odd signal by using the first clock delay even signal, to obtain a first intermediate sampling even signal.

The fifth NOT gate 485 is configured to perform a NOT operation on the to-be-processed chip select even signal to obtain a second chip select inverted even signal.

the fourth NOR gate 486 is configured to perform a NOR operation on the fifth intermediate sampling even signal and the second chip select inverted even signal to obtain a sixth intermediate sampling even signal.

The sixth NOT gate 487 is configured to perform a NOT operation on the first clock delay even signal to obtain a second inverted clock even signal.

The twelfth sampling circuit 488 is configured to perform sampling processing on the sixth intermediate sampling even signal by using the second inverted clock even signal, to obtain a seventh intermediate sampling even signal.

The fourth OR gate 489 is configured to perform an OR operation on the sixth intermediate sampling even signal and the seventh intermediate sampling even signal to obtain an eighth intermediate sampling even signal.

The fourth AND gate 490 is configured to perform an AND operation on the eighth intermediate sampling even signal and the first clock delay even signal to obtain the second chip select clock even signal.

It is to be noted that, in the fourth logic circuit 632, the eleventh sampling circuit 484 may be composed of an eleventh flip-flop and a sixth inverter, and the twelfth sampling circuit 488 may be composed of a twelfth flip-flop. The eleventh flip-flop and the eleventh flip-flop may be D-type flip-flops. In addition, it is also to be noted that, for the eleventh sampling circuit 484, the sixth inverter may not be provided. The subsequent logic operation needs to be adjusted correspondingly. For example, the fifth NOT gate 485 is removed, and the fourth NOR gate 486 is adjusted to an OR gate, so that the same effect may also be achieved.

Specifically, in FIG. 7, an input terminal of the eleventh flip-flop is inputted with the to-be-processed chip select odd signal, a clock terminal of the eleventh flip-flop is inputted with the first clock delay even signal, an output terminal of the eleventh flip-flop is inputted with an input terminal of the sixth inverter, and an output terminal of the sixth inverter is configured to output the fifth intermediate sampling even signal. One input terminal of the fourth NOR gate 486 is inputted with the output terminal of the sixth inverter, another input terminal of the fourth NOR gate 486 is inputted with an output terminal of the fifth NOT gate 485, an input terminal of the fifth NOT gate 485 is configured to receive the to-be-processed chip select even signal, an output terminal of the fourth NOR gate 486 is configured to output the sixth intermediate sampling even signal, and an output terminal of the fourth NOR gate 486 is inputted with an input terminal of the twelfth flip-flop. A clock terminal of the twelfth flip-flop is inputted with an output terminal of the sixth NOT gate 487, and an input terminal of the sixth NOT gate 487 is configured to receive the first clock delay even signal. An output terminal of the twelfth flip-flop is configured to output the seventh intermediate sampling even signal, the output terminal of the twelfth flip-flop is inputted with one input terminal of the fourth OR gate 489, another input terminal of the fourth OR gate 489 is configured to receive the sixth intermediate sampling even signal, an output terminal of the fourth OR gate 489 is configured to output the eighth intermediate sampling even signal, and the output terminal of the fourth OR gate 489 is inputted with one input terminal of the fourth AND gate 490, another input terminal of the fourth AND gate 490 is configured to receive the first clock delay even signal, and an output terminal of the fourth AND gate 490 is configured to output the second chip select clock even signal.

It is also to be noted that, in the embodiment of the disclosure, the to-be-processed chip select odd signal is represented by PCS_O, the fifth intermediate sampling even signal outputted by the eleventh sampling circuit 484 may be represented by PCSB_E, and the sixth intermediate sampling even signal outputted by the fourth NOR gate 486 may be represented by NT_PCS_EEN1, the seventh intermediate sampling even signal outputted by the twelfth sampling circuit 488 may be represented by NT_PCS_EEN2, the eighth intermediate sampling even signal outputted by the fourth OR gate 489 may be represented by NT_PCS_EEN, and the second chip select clock even signal outputted by the fourth AND gate 490 may be represented by NT_CLK_E.

It is also to be understood that for the third logic circuit 631, the ninth sampling circuit 477 may be regarded as a rising edge sampling circuit, that is, sampling processing is performed by using the rising edge of the first clock delay odd signal. The fourth NOT gate 480 and the tenth sampling circuit 481 may be regarded as a falling edge sampling circuit, that is, sampling processing is performed by using the falling edge of the first clock delay odd signal. For the fourth logic circuit 632, the eleventh sampling circuit 484 may be regarded as a rising edge sampling circuit, that is, sampling processing is performed by using the rising edge of the first clock delay even signal. The sixth NOT gate 487 and the twelfth sampling circuit 488 may be regarded as a falling edge sampling circuit, that is, sampling processing is performed by using the falling edge of the first clock delay even signal. That is, in the embodiment of the disclosure, the PCS_E/PCS_O signal is continuously sampled by a first-stage rising edge sampling circuit and a first-stage falling edge sampling circuit, and then the high-level pulse width of the chip select signal is increased by OR logic, thereby generating NT_CLK_O/NT_CLK_E signal with two pulses.

That is, the third OR gate 482 and the fourth OR gate 489 both have the function of widening the pulse width of the signal. Taking the third OR gate 482 as an example, the pulse width of the NT_PCS_OEN1 signal is twice the preset clock cycle, and the pulse width of the NT_PCS_OEN2 signal is also twice the preset clock cycle, but is delayed by a preset clock cycle compared with the NT_PCS_OEN1 signal. In this way, an OR operation is performed on the NT_PCS_OEN1 signal and the NT_PCS_OEN2 signal by the third OR gate 482, to obtain the NT_PCS_OEN signal, and the pulse width is three times the preset clock cycle. An AND operation is performed on the NT_PCS_OEN signal and the PCLK_OO signal by the third AND gate 483, to obtain an NT_CLK_O signal with two pulses, and the pulse width of each pulse is a preset clock cycle. Similarly, the pulse width of the NT_PCS_EEN signal outputted by the fourth OR gate 489 is also three times the preset clock cycle. An AND operation is performed on the NT_PCS_EEN signal and the PCLK_EE signal by the fourth AND gate 490 to obtain an NT_CLK_E signal with two pulses, and the pulse width of each pulse is a preset clock cycle.

In this way, responsive to the pulse width of the first chip select signal being twice the preset clock cycle, two-stage sampling and logic operation processing is performed on the PCS_E signal by the third logic circuit 631 to obtain the NT_CLK_O signal. Two-stage sampling and logic operation processing is performed on the PCS_O signal by the fourth logic circuit 632 to obtain the NT_CLK_E signal. According to the NT_CLK_O signal and the NT_CLK_E signal, the target instruction signal that may be decoded is the NT ODT CMD signal.

In some embodiments, based on the signal sampling circuit 60 illustrated in FIG. 6, as illustrated in FIG. 7, the instruction decoding circuit 64 may include a first instruction decoding circuit 641 and a second instruction decoding circuit 642.

The first instruction decoding circuit 641 is configured to receive the first chip select clock signal, and perform decoding and sampling processing on the to-be-processed instruction signal according to the first chip select clock signal and the to-be-processed chip select signal, to obtain a first target instruction signal.

The second instruction decoding circuit 642 is configured to receive the second chip select clock signal, and perform decoding and sampling processing on the to-be-processed instruction signal according to the second chip select clock signal and the to-be-processed chip select signal, to obtain a second target instruction signal.

In the embodiment of the disclosure, the first target instruction signal is a Command signal in the DDR5 DRAM chip. Since the valid pulse of the signal lasts for two clock cycles, it may be referred to as the 2T CMD signal. The Command signal includes a read command signal, a write command signal, a refresh command signal, a precharge command signal, and an active command signal. The second target instruction signal may be a Non-Target ODT Command signal in the DDR5 DRAM chip, which may be referred to as the NT ODT CMD signal.

It is understood that, in some embodiments, the initial chip select signal may be a signal indicating that the target chip is selected, and the initial chip select signal is a low-level valid pulse signal. If the pulse width of the initial chip select signal is a preset clock cycle, then the first chip select clock signal is determined to be a valid pulse signal, and the first target instruction signal outputted by the first instruction decoding circuit is determined to be the target instruction signal. If the pulse width of the initial chip select signal is twice the preset clock cycle, the second chip select clock signal is determined to be a valid pulse signal, and the second target instruction signal outputted by the second instruction decoding circuit is determined to be the target instruction signal.

It is to be noted that, in the embodiment of the disclosure, responsive to the pulse width of the initial chip select signal being the preset clock cycle, the first chip select clock signal is determined, specifically including the 2T_CLK_E signal and the 2T_CLK_O signal. The first target instruction signal may be obtained as the 2T CMD signal by the first instruction decoding circuit 641 using the 2T_CLK_E signal/the 2T_CLK_O signal.

It is also to be noted that, in the embodiment of the disclosure, responsive to the pulse width of the initial chip select signal being twice the preset clock cycle, the second chip select clock signal is determined, specifically including the NT_CLK_E signal and the NT_CLK_O signal. The second target instruction signal may be obtained as the NT ODT CMD signal by the second instruction decoding circuit 642 using the NT_CLK_E signal/the NT_CLK_O signal.

In a specific embodiment, for the first instruction decoding circuit 641, as illustrated in FIG. 7, the first instruction decoding circuit 641 may include a first decoding sampling circuit 491 and a fifth OR gate 492.

The first decoding sampling circuit 491 is configured to perform decoding and sampling processing on the to-be-processed instruction even signal according to the first chip select clock odd signal and the to-be-processed chip select even signal to obtain a first instruction even signal, and perform decoding and sampling processing on the to-be-processed instruction odd signal according to the first chip select clock even signal and the to-be-processed chip select odd signal to obtain a first instruction odd signal.

The fifth OR gate 492 is configured to perform an OR operation on the first instruction even signal and the first instruction odd signal to obtain the first target instruction signal.

It is to be noted that, in the embodiment of the disclosure, the first decoding sampling circuit 491 here may also be called an instruction decoding flip-flop, which is represented by CMD DEC DFF. The output of the first decoding sampling circuit includes the first instruction even signal and the first instruction odd signal. The first instruction even signal is represented by 2T_CMD_E, and the first instruction odd signal is represented by 2T_CMD_O. After the OR operation is performed on the 2T_CMD_E signal and the 2T_CMD_O signal, the first target instruction signal obtained is a 2T CMD signal.

Figure 8A:
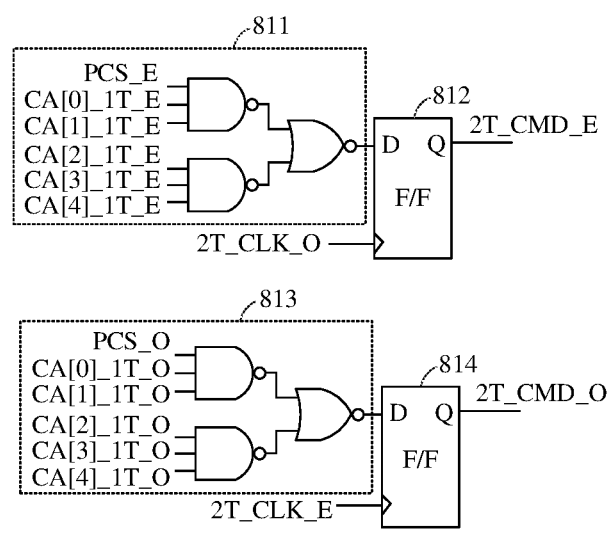
FIG. 8A is a schematic diagram of a composition structure of a first decoding sampling circuit according to an embodiment of the disclosure.

It is also to be noted that, in the embodiment of the disclosure, as illustrated in FIG. 8A, the first decoding sampling circuit 491 may include a first decoding circuit 811, a thirteenth sampling circuit 812, a second decoding circuit 813, and a fourteenth sampling circuit 814.

The first decoding circuit 811 is configured to perform decoding processing on the to-be-processed chip select even signal and the to-be-processed instruction even signal to obtain a first decoding even signal.

The thirteenth sampling circuit 812 is configured to perform sampling processing on the first decoding even signal by using the first chip select clock odd signal, to obtain the first instruction even signal.

The second decoding circuit 813 is configured to perform decoding processing on the to-be-processed chip select odd signal and the to-be-processed instruction odd signal to obtain a first decoding odd signal.

The fourteenth sampling circuit 814 is configured to perform sampling processing on the first decoding odd signal by using the first chip select clock even signal, to obtain the first instruction odd signal.

It is to be noted that, in FIG. 8A, the to-be-processed instruction even signal may include five signals, i.e., CA[0]_1T_E, CA[1]_1T_E, CA[2]_1T_E, CA[3]_1T_E, and CA[4]_1T_E. Moreover, the first decoding circuit 811 may be composed of a three-input NAND gate, a three-input NAND gate, and a two-input NOR gate. PCS_E, CA[0]_1T_E, and CA[1]_1T_E are inputted to the first three-input NAND gate. CA[2]_1T_E, CA[3]_1T_E, and CA[4]_1T_E are inputted to the second three-input NAND gate. Then, an output terminal of the first three-input NAND gate is inputted with one input terminal of the two-input NOR gate, and an output terminal of the second three-input NAND gate is inputted with another input terminal of the two-input NOR gate. An output terminal of the two-input NOR gate is configured to output a first decoding even signal, so as to realize the decoding of the to-be-processed chip select even signal and the to-be-processed instruction even signal. After the first decoding even signal is obtained, sampling output is performed by using the thirteenth sampling circuit 812. Specifically, the thirteenth sampling circuit 812 may be a D-type flip-flop. A clock terminal of the D-type flip-flop is inputted with the 2T_CLK_O signal, an input terminal of the D-type flip-flop is inputted with the output terminal of the two-input NOR gate, and the output terminal of the D-type flip-flop is configured to output the 2T_CMD_E signal.

It is also to be noted that, in FIG. 8A, the to-be-processed instruction odd signal may include five signals, i.e., CA[0]_1T_O, CA[1]_1T_O, CA[2]_1T_O, CA[3]_1T_O, and CA[4]_1T_O. Moreover, the second decoding circuit 813 may be composed of a three-input NAND gate, a three-input NAND gate, and a two-input NOR gate. PCS_O, CA[0]_1T_O, and CA[1]_1T_O are inputted to the first three-input NAND gate. CA[2]_1T_O, CA[3]_1T_O, and CA[4]_1T_O are inputted to the second three-input NAND gate. Then, an output terminal of the first three-input NAND gate is inputted with one input terminal of the two-input NOR gate, and an output terminal of the second three-input NAND gate is inputted with another input terminal of the two-input NOR gate. An output terminal of the two-input NOR gate is configured to output a first decoding odd signal, so as to realize the decoding of the to-be-processed chip select even signal and the to-be-processed instruction even signal. After the first decoding odd signal is obtained, sampling output is performed by using the fourteenth sampling circuit 814. Specifically, the fourteenth sampling circuit 814 may also be a D-type flip-flop. A clock terminal of the D-type flip-flop is inputted with the 2T_CLK_E signal, an input terminal of the D-type flip-flop is inputted with the output terminal of the two-input NOR gate, and the output terminal of the D-type flip-flop is configured to output the 2T_CMD_O signal.

In another specific embodiment, for the second instruction decoding circuit 642, as illustrated in FIG. 7, the second instruction decoding circuit 642 may include a second decoding sampling circuit 493 and a sixth OR gate 494.

The second decoding sampling circuit 493 is configured to perform decoding and sampling processing on the to-be-processed instruction even signal according to the second chip select clock odd signal and the to-be-processed chip select even signal to obtain a second instruction even signal, and perform decoding and sampling processing on the to-be-processed instruction odd signal according to the second chip select clock even signal and the to-be-processed chip select odd signal to obtain a second instruction odd signal.

The sixth OR gate 494 is configured to perform an OR operation on the second instruction even signal and the second instruction odd signal to obtain the second target instruction signal.

It is also to be noted that, in the embodiment of the disclosure, the second decoding sampling circuit 493 here may also be called an instruction decoding flip-flop, which is represented by CMD DEC DFF. The output of the second decoding sampling circuit includes the second instruction even signal and the second instruction odd signal. The second instruction even signal is represented by NT_CMD_E, and the second instruction odd signal is represented by NT_CMD_O. After the OR operation is performed on the NT_CMD_E signal and the NT_CMD_O signal, the second target instruction signal obtained is an NT ODT CMD signal.

Figure 8B:
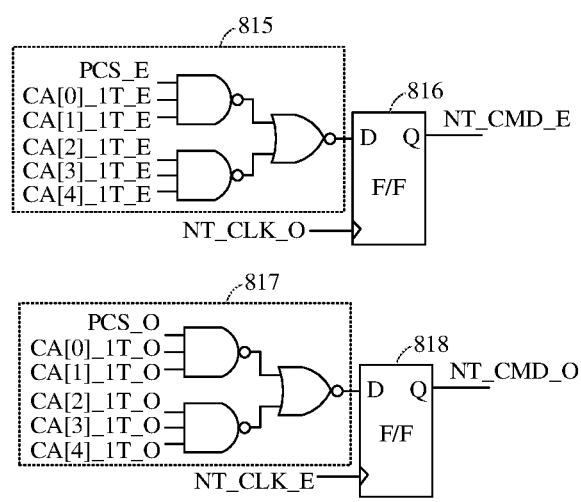
FIG. 8B is a schematic diagram of a composition structure of a second decoding sampling circuit according to an embodiment of the disclosure.

It is also to be noted that, in the embodiment of the disclosure, as illustrated in FIG. 8B, the second decoding sampling circuit 493 may include a third decoding circuit 815, a fifteenth sampling circuit 816, a fourth decoding circuit 817, and a sixteenth sampling circuit 818.

The third decoding circuit 815 is configured to perform decoding processing on the to-be-processed chip select even signal and the to-be-processed instruction even signal to obtain a second decoding even signal.

The fifteenth sampling circuit 816 is configured to perform sampling processing on the second decoding even signal by using the second chip select clock odd signal, to obtain the second instruction even signal.

The fourth decoding circuit 817 is configured to perform decoding processing on the to-be-processed chip select odd signal and the to-be-processed instruction odd signal to obtain a second decoding odd signal.

The sixteenth sampling circuit 818 is configured to perform sampling processing on the second decoding odd signal by using the second chip select clock even signal, to obtain the second instruction odd signal.

It is to be noted that, in FIG. 8B, the input signal of the third decoding circuit 815 is the same as that of the first decoding circuit 811. After the second decoding even signal is obtained according to the third decoding circuit 815, sampling output is performed by using the fifteenth sampling circuit 816. Specifically, the fifteenth sampling circuit 816 may be a D-type flip-flop. A clock terminal of the D-type flip-flop is inputted with the NT_CLK_O signal, an input terminal of the D-type flip-flop is inputted with ab output terminal of the two-input NOR gate, and an output terminal of the D-type flip-flop is configured to output the NT_CMD_E signal.

It is also to be noted that, in FIG. 8B, the input signal of the fourth decoding circuit 817 is the same as that of the second decoding circuit 813. After the second decoding even signal is obtained according to the fourth decoding circuit 817, sampling output is performed by using the sixteenth sampling circuit 818. Specifically, the sixteenth sampling circuit 818 may also be a D-type flip-flop. A clock terminal of the D-type flip-flop is inputted with the NT_CLK_E signal, an input terminal of the D-type flip-flop is inputted with the output terminal of the two-input NOR gate, and the output terminal of the D-type flip-flop is configured to output the NT_CMD_O signal.

In addition, it is noted that, the design of the decoding circuits such as the first decoding circuit 811, the second decoding circuit 813, the third decoding circuit 815, and the fourth decoding circuit 817 is specifically realized according to the instruction decoding rule. For different products, different application scenarios, and different instructions, the decoding rules may be different, and the logic of the decoding circuit may also be adjusted accordingly, which is not specifically limited in the embodiments of the disclosure.

In this way, by adding the first instruction sampling circuit 62 and the second instruction sampling circuit 63, the 2T_CLK_E/2T_CLK_O signal or the NT_CLK_E/NT_CLK_O signal may be outputted due to the different pulse widths of the first chip select signals used by the two instruction sampling circuits. Thus, responsive to the pulse width of the first chip select signal being the preset clock cycle, the first target instruction signal obtained by the first instruction decoding circuit 641 using the 2T_CLK_E/2T_CLK_O signal is a valid signal (i.e., a high-level valid pulse signal). The second target instruction signal obtained by the second instruction decoding circuit 642 is an invalid signal (i.e., a low-level signal). On the contrary, responsive to the pulse width of the first chip select signal being twice the preset clock cycle, the first target instruction signal obtained by the first instruction decoding circuit 641 using the NT_CLK_E/NT_CLK_O signal is an invalid signal (i.e., a low-level signal), and the second target instruction signal obtained by the second instruction decoding circuit 642 is a valid signal (i.e., a high-level valid pulse signal), so that the 2T CMD and NT ODT CMD signals may be correctly distinguished and decoded accurately.

That is, if the pulse width of the initial chip select signal is the preset clock cycle, in one possible implementation, if a rising edge of the first chip select signal in an even clock cycle is sampled as a low level, and the rising edge in a next adjacent odd clock cycle is sampled as a high level, the first chip select clock odd signal is determined to be a high-level valid pulse signal, and the first chip select clock odd signal has two pulses. A rising edge of the first pulse in the first chip select clock odd signal is configured to generate a rising edge of the first target instruction signal, and a rising edge of the second pulse in the first chip select clock odd signal is configured to generate a falling edge of the first target instruction signal.

In another possible implementation, if the rising edge of the first chip select signal in an odd clock cycle is sampled as a low level, and the rising edge in a next adjacent even clock cycle is sampled as a high level, the first chip select clock even signal is determined to be a high-level valid pulse signal, and the first chip select clock even signal has two pulses. A rising edge of the first pulse in the first chip select clock even signal is configured to generate a rising edge of the first target instruction signal, and a rising edge of the second pulse in the first chip select clock even signal is configured to generate a falling edge of the first target instruction signal.

If the pulse width of the initial chip select signal is twice the preset clock cycle, in one possible implementation, if a rising edge of the first chip select signal in an even clock cycle is sampled as a low level, and the rising edge in a next adjacent odd clock cycle is still sampled as a low level, the second chip select clock odd signal is determined to be a high-level valid pulse signal, and the second chip select clock odd signal has two pulses. A rising edge of the first pulse in the second chip select clock odd signal is configured to generate a rising edge of the second target instruction signal, and a rising edge of the second pulse in the second chip select clock odd signal is configured to generate a falling edge of the second target instruction signal.

In another possible implementation, if the rising edge of the first chip select signal in an odd clock cycle is sampled as a low level, and the rising edge in a next adjacent even clock cycle is still sampled as a low level, the second chip select clock even signal is determined to be a high-level valid pulse signal, and the second chip select clock even signal has two pulses. A rising edge of the first pulse in the second chip select clock even signal is configured to generate a rising edge of the second target instruction signal, and a rising edge of the second pulse in the second chip select clock even signal is configured to generate a falling edge of the second target instruction signal.

Here, the even clock cycle or the odd clock cycle refers to a clock cycle of the initial clock signal (represented by CK_t/CK_c). Specifically, after the frequency division processing of the third receiving circuit 453, the PCLK_E signal and the PCLK_O signal may be obtained. Then the clock cycle at which the rising edge of the PCLK_E signal is located is regarded as an even clock cycle, and the clock cycle at which the rising edge of the PCLK_O signal is located is regarded as an odd clock cycle. In addition, it is also to be noted that "the pulse width is a preset clock cycle" or "the pulse width is twice the preset clock cycle" here refers to the preset accuracy range, which may be the deviation between the pulse width and a preset clock cycle is within the preset accuracy range, or the deviation between the pulse width and twice the preset clock cycle is within the preset accuracy range.

In this way, both the 2T_CLK_E signal and the 2T_CLK_O signal include two pulses, and the pulse width of each pulse is a preset clock cycle. The rising edge of the first pulse is configured to generate the rising edge of the first target instruction signal, and the rising edge of the second pulse is configured to generate the falling edge of the first target instruction signal, so that the pulse width of the finally outputted first target instruction signal may satisfy twice the preset clock cycle. In addition, both the NT_CLK_E signal and the NT_CLK_O signal include two pulses, and the pulse width of each pulse is a preset clock cycle, and the rising edge of the first pulse is configured to generate the rising edge of the second target instruction signal, and the rising edge of the second pulse is configured to generate the falling edge of the second target instruction signal, so that the pulse width of the finally outputted second target instruction signal may also satisfy twice the preset clock cycle. In this way, the problem of uncertainty of the pulse width of the target instruction signal may be avoided, and the 2T CMD and NT ODT CMD instructions may be distinguished and decoded accurately, without affecting each other.

The embodiments of the disclosure provide a signal sampling circuit. Based on the signal sampling circuit, the problem of uncertainty of the pulse width of the target instruction signal may be avoided, and in a case that the pulse widths of the first chip select signals are different, two types of instructions, i.e., 2T CMD and NT ODT CMD, may also be correctly distinguished according to the resulting first chip select clock signal and the second chip select clock signal, and decoded accurately without affecting each other, thereby avoiding the problem of an incorrect operation caused by an instruction decoding error.

Figure 9:
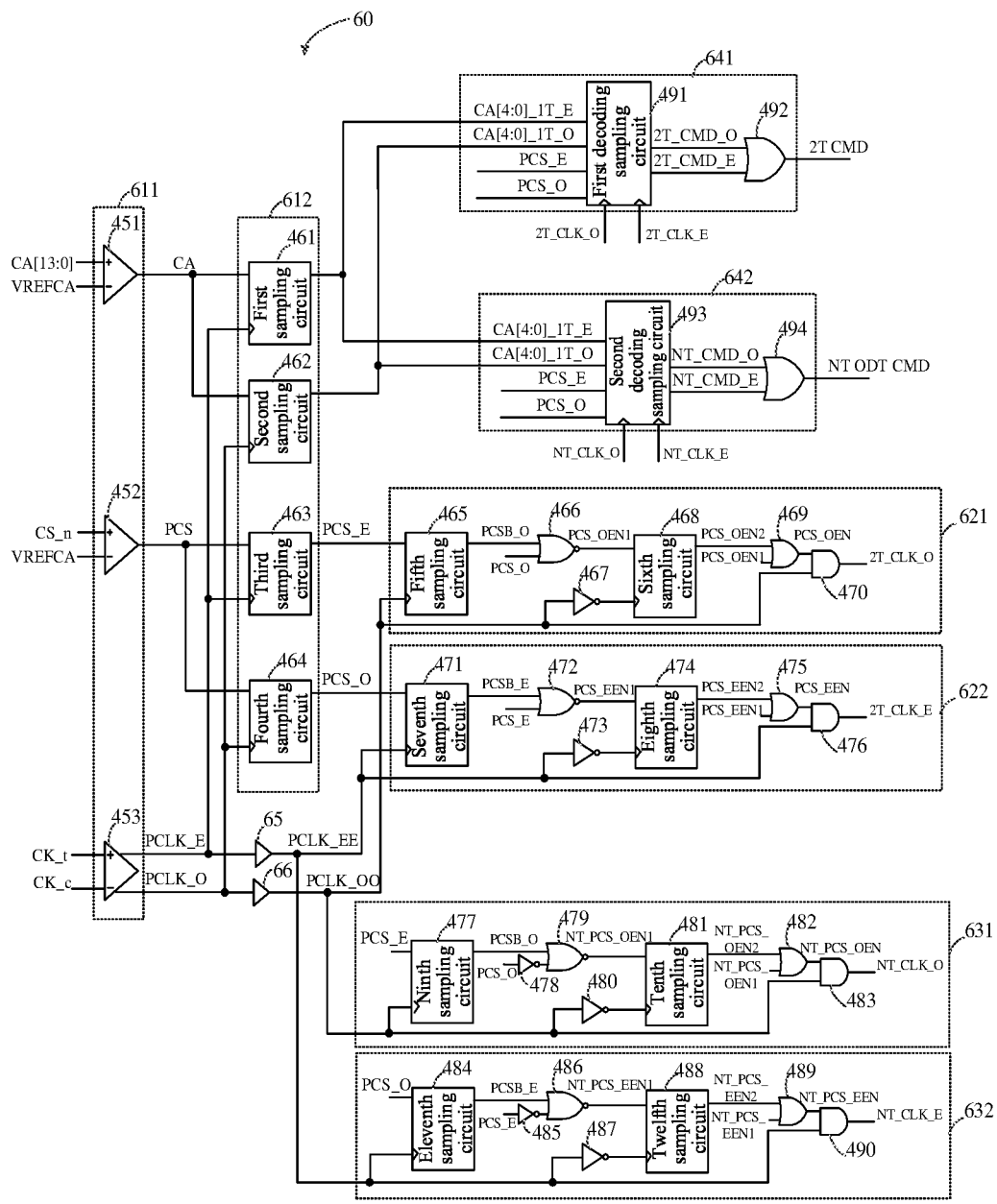
FIG. 9 is a schematic diagram of a detailed structure of a signal sampling circuit according to an embodiment of the disclosure.

In another embodiment of the disclosure, based on the signal sampling circuit 60 as described in the foregoing embodiments, FIG. 9 illustrates a schematic diagram of a detailed structure of a signal sampling circuit according to the embodiment of the disclosure. As illustrated in FIG. 9, the signal sampling circuit 60 may include a first receiver 911, a second receiver 912, a third receiver 913, a first flip-flop 914, a second flip-flop 915, a third flip-flop 916, a first inverter 917, a fourth flip-flop 918, a second inverter 919, a first buffer 920, a second buffer 921, a fifth flip-flop 922, a third inverter 923, a first NOR gate 924, a first NOT gate 925, a sixth flip-flop 926, a first OR gate 927, a first AND gate 928, a seventh flip-flop 929, a fourth inverter 930, a second NOR gate 931, a second NOT gate 932, an eighth flip-flop 933, a second OR gate 934, a second AND gate 935, a ninth flip-flop 936, a fifth inverter 937, a third NOT gate 938, a third NOR gate 939, a fourth NOT gate 940, a tenth flip-flop 941, a third OR gate 942, a third AND gate 943, an eleventh flip-flop 944, a sixth inverter 945, a fifth NOT gate 946, a fourth NOR gate 947, a sixth NOT gate 948, a twelfth flip-flop 949, a fourth OR gate 950, a fourth AND gate 951, a first instruction decoding flip-flop 952, a fifth OR gate 953, a second instruction decoding flip-flop 954, and a sixth OR gate 955. The first flip-flop 914, the second flip-flop 915, the third flip-flop 916, the fourth flip-flop 918, the fifth flip-flop 922, the sixth flip-flop 926, the seventh flip-flop 929, the eighth flip-flop 933, the ninth flip-flop 936, the tenth flip-flop 941, the eleventh flip-flop 944, and the twelfth flip-flop 949 may all be D-type flip-flops. In addition, the specific structure of the first instruction decoding flip-flop 952 is as illustrated in FIG. 8A, and the specific structure of the second instruction decoding flip-flop 954 is as illustrated in FIG. 8B.

It is to be noted that the composition structure of FIG. 9 is similar to that of FIG. 7. Therefore, reference may be made to the related description of FIG. 7 for the description of FIG. 9, which is not described in detail here.

In the 2T CLK circuit, rising edge sampling processing is performed on the PCS_E signal by the fifth flip-flop 922 using the PCLK_OO signal, and then the PCSB_O signal may be obtained by the third inverter 923. The NOR operation is performed on the PCSB_O signal and the PCS_O signal by the first NOR gate 924 to obtain the PCS_OEN1 signal. Falling edge sampling processing is performed on the PCS_OEN1 signal by the first NOT gate 925 and the sixth flip-flop 926 using the PCLK_OO signal, to obtain the PCS_OEN2 signal. The OR operation is performed on the PCS_OEN1 signal and the PCS_OEN2 signal by the first OR gate 927 to obtain PCS_OEN. The AND operation is performed on the PCS_OEN signal and the PCLK_OO signal by the first AND gate 928 to obtain the 2T_CLK_O signal. Similarly, rising edge sampling processing is performed on the PCS_O signal by the seventh flip-flop 929 using the PCLK_EE signal, and the 2T_CLK_E signal may be obtained through the fourth inverter 930, the second NOR gate 931, the second NOT gate 932, the eighth flip-flop 933, the second OR gate 934, and the second AND gate 935. Here, there is at most one valid signal among the 2T_CLK_O signal and the 2T_CLK_E signal.

In the NT ODT CLK circuit, rising edge sampling processing is performed on the PCS_E signal by the ninth flip-flop 936 using the PCLK_OO signal, and then the PCSB_O signal may be obtained by the fifth inverter 937. The NOT operation is performed on PCS_O signal by the third NOT gate 938 to obtain the second chip select inverted odd signal, and the NOR operation is performed on the PCSB_O signal and the second chip select inverted odd signal by the third NOR gate 939, to obtain the NT_PCS_OEN1 signal. Falling edge sampling processing is performed on the NT_PCS_OEN1 signal by the fourth NOT gate 940 and the tenth flip-flop 941 using the PCLK_OO signal, to obtain the NT_PCS_OEN2 signal. The OR operation is performed on the NT_PCS_OEN1 signal and the NT_PCS_OEN2 signal by the third OR gate 942 to obtain the NT_PCS_OEN signal. The AND operation is performed on the NT_PCS_OEN signal and the PCLK_OO signal by the third AND gate 943 to obtain the NT_CLK_O signal. Similarly, rising edge sampling processing is performed on the PCS_O signal by the eleventh flip-flop 944 using the PCLK_EE signal, and then the PCSB_E signal can be obtained through the sixth inverter 945. The NT_CLK_E signal may be obtained by the fifth NOT gate 946, the fourth NOR gate 947, the sixth NOT gate 948, the twelfth flip-flop 949, the fourth OR gate 950, and the fourth AND gate 951. Here, there is at most one valid signal among the NT_CLK_O signal and the NT_CLK_E signal.

Finally, decoding and sampling processing is performed on the CA[4:0]_1T_E signal, the CA[4:0]_1T_O signal, the PCS_E signal, and the PCS_O signal by the first instruction decoding flip-flop 952 using the 2T_CLK_O signal and the 2T_CLK_E signal, to obtain the 2T_CMD_E signal and the 2T_CMD_O signal. An OR logic operation is performed on the 2T_CMD_E signal and the 2T_CMD_O signal by the fifth OR gate 953 to obtain the 2T CMD signal. Decoding and sampling processing is performed on the CA[4:0]_1T_E signal, the CA[4:0]_1T_O signal, the PCS_E signal, and the PCS_O signal by the second instruction decoding flip-flop 954 using the NT_CLK_O signal and the NT_CLK_E signal, to obtain the NT_CMD_E signal and the NT_CMD_O signal. An OR logic operation is performed on the NT_CMD_E signal and the NT_CMD_O signal by the sixth OR gate 955 to obtain the NT ODT CMD signal.

That is, in the embodiment of the disclosure, the PCS_E signal/PCS_O signal is continuously sampled by using a first-stage rising edge flip-flop and a first-stage falling edge flip-flop, and then the high-level pulse width of the chip select signal is increased through an OR logic, and then an AND logic is performed on the PLCK_OO/PLCK_EE signal to generate a chip select clock signal with two pulses for sampling the target instruction. Through the signal sampling circuit 60, both the first chip select clock signal and the second chip select clock signal include two pulses, and the pulse width of each pulse is a preset clock cycle, and then the decoded instruction is sampled by using the chip select clock signal. In one case, the embodiment of the disclosure determines that the CS_n signals of the first clock cycle and the second clock cycle are respectively at a low level and a high level through the NOR logic of the PCSB_O signal and the PCS_O signal. It may be determined that an instruction to be sampled and decoded is 2T CMD, and then the 2T_CLK_O signal/2T_CLK_E signal covered by this logic is used for instruction sampling and decoding, and the 2T_CMD signal is outputted. In another case, the embodiment of the disclosure determines that the CS_n signals of the first clock cycle and the second clock cycle are both at a low level through the NOT logic of the PCSB_O signal and the PCS_O signal, and it may be determined that the instruction to be sampled and decoded is NT ODT CMD, and then the NT_CLK_O signal/NT_CLK_E signal covered by this logic is used for instruction sampling and decoding, and the NT ODT CMD signal is outputted.

Figure 10:
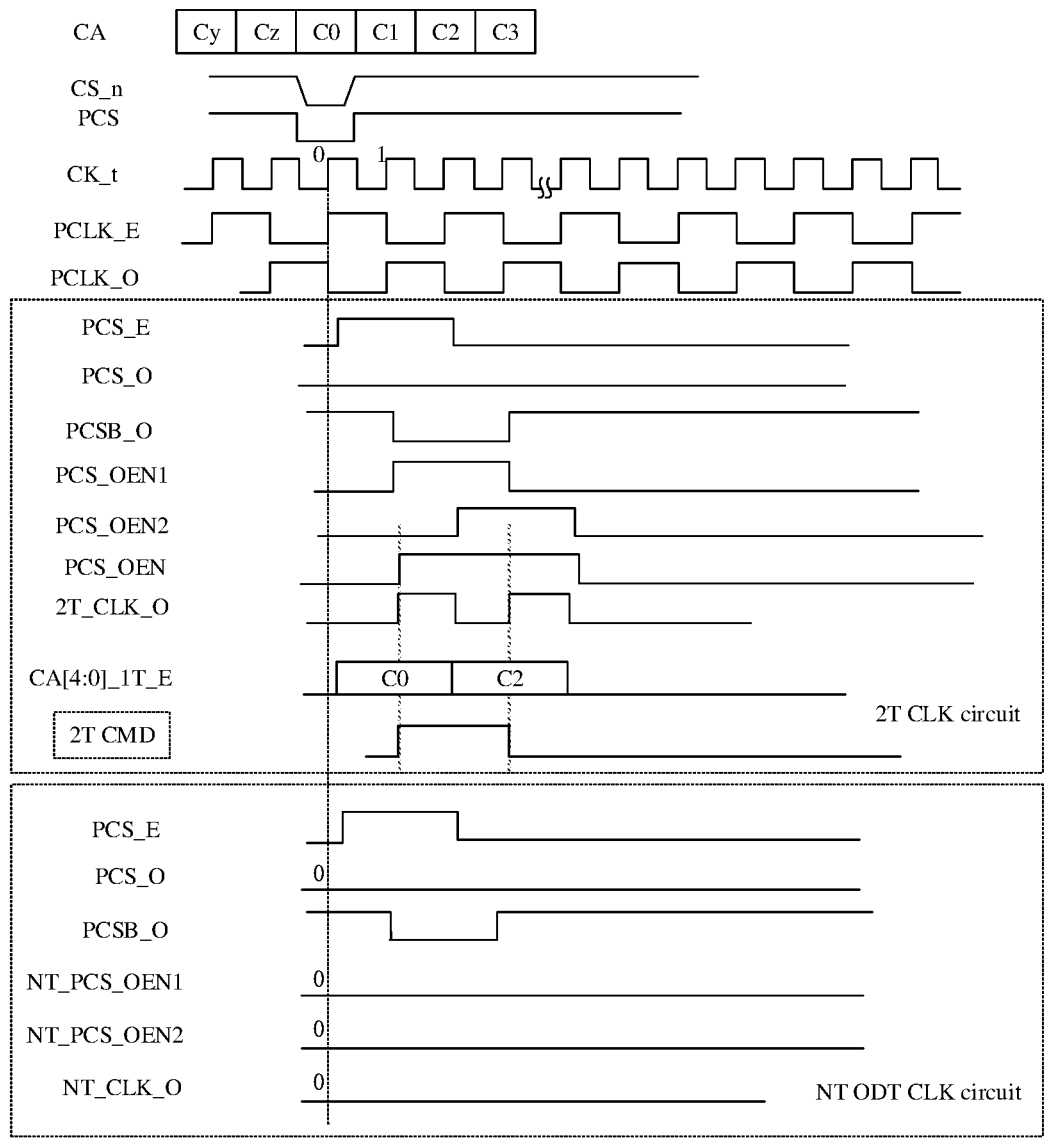
FIG. 10 is a schematic diagram of a signal timing sequence of a signal sampling circuit according to an embodiment of the disclosure.
Figure 11:
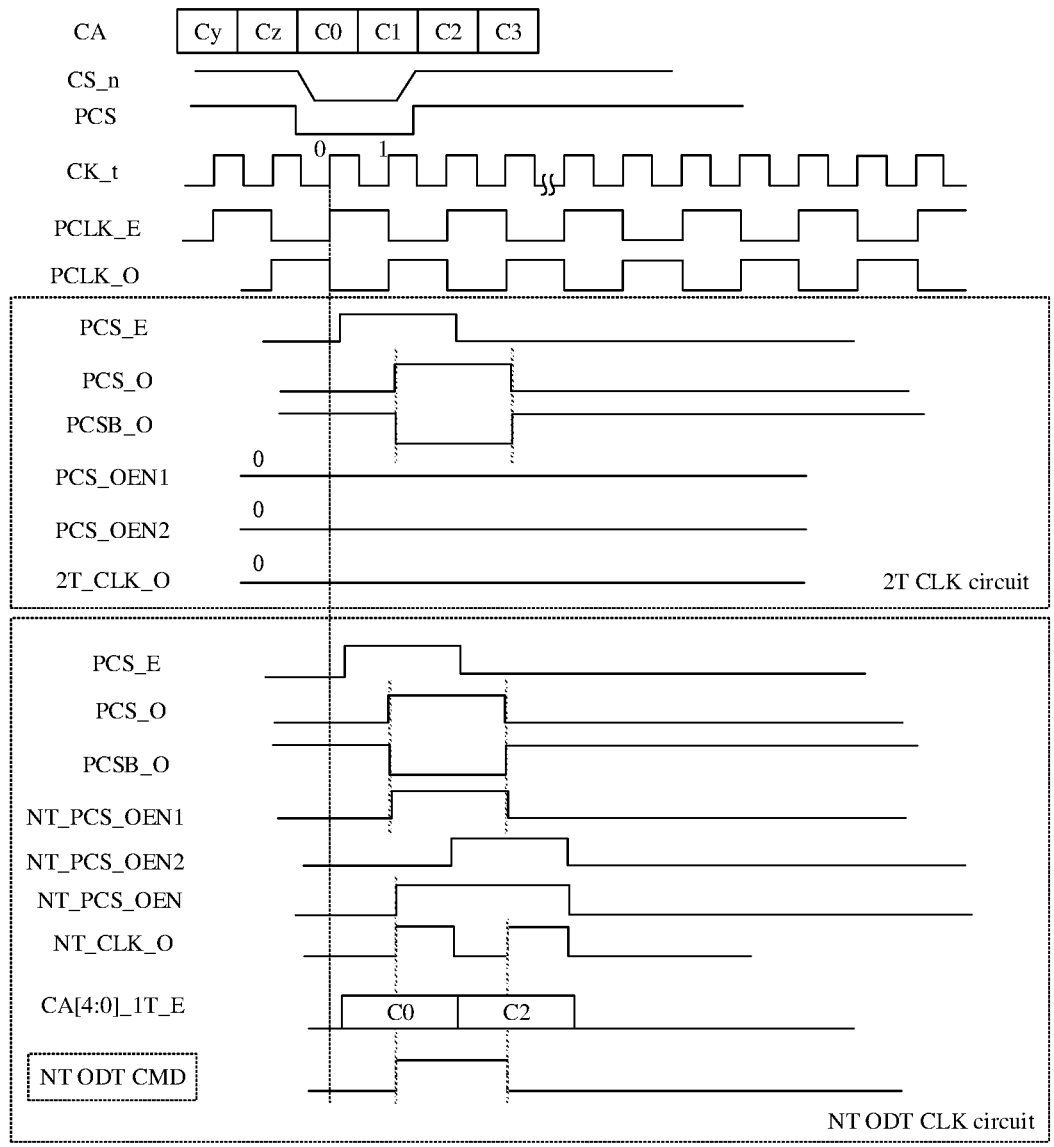
FIG. 11 is a schematic diagram of a signal timing sequence of another signal sampling circuit according to an embodiment of the disclosure.

Based on the signal sampling circuit 60 as illustrated in FIG. 9, the corresponding signal timing diagrams are as illustrated in FIG. 10 and FIG. 11. In FIG. 10 and FIG. 11, the first command address signal is represented by CA, and CA may include Cy, Cz, C0, C1, C2 and C3. The initial chip select signal is represented by CS_n, and the first chip select signal is represented by PCS. The CS_n signal is a low-level valid pulse signal, and is configured to represent a signal indicating that the target chip is selected. The initial clock signal is represented by CK_t, the first clock even signal is represented by PCLK_E, the first clock odd signal is represented by PCLK_O, the clock cycle of the CK_t signal is the preset clock cycle, and the clock cycles of the PCLK_E signal and the PCLK_O signal are twice the preset clock cycle.

Taking the clock cycle where the rising edge of the PCLK_E signal is located as an even clock cycle, and the clock cycle where the rising edge of the PCLK_O signal is located as an odd clock cycle as an example, responsive to the pulse width of the PCS signal being a preset clock cycle, FIG. 10 illustrates a schematic diagram of a signal timing sequence of a signal sampling circuit according to an embodiment of the disclosure. As illustrated in FIG. 10, in the 2T CLK circuit, after the CA signal is sampled by the rising edge of the PCLK_E signal, the CA[4:0]_1T_E signal is obtained, including C0 and C2. The PCS_E signal obtained after sampling and inverting the PCS signal with the rising edge of the PCLK_E signal is a high-level valid pulse signal, and the pulse width is twice the preset clock cycle. At this time, the PCS_O signal obtained after sampling and inverting the PCS signal with the rising edge of the PCLK_O signal is a low-level signal. The PCSB_O signal obtained after rising edge sampling and inverting processing is performed on the PCS_E signal by the fifth flip-flop 922 and the third inverter 923 is a low-level valid pulse signal, and the pulse width is twice the preset clock cycle, but is delayed by a preset clock cycle compared with the PCS_E signal. Then the PCS_OEN1 signal obtained after the NOR operation is performed on the PCSB_O signal and the PCS_O signal by the first NOR gate 924 is a high-level valid pulse signal, and the pulse width is twice the preset clock cycle. Then the PCS_OEN2 signal obtained after falling edge sampling processing is performed on the PCS_OEN1 signal by the first NOT gate 925 and the sixth flip-flop 926 is also a high-level valid pulse signal, and the pulse width is twice the preset clock cycle, but is delayed by a preset clock cycle compared with the PCS_OEN1 signal. In this way, the PCS_OEN signal obtained after the OR operation is performed on the PCS_OEN1 signal and the PCS_OEN2 signal by the first OR gate 927 is a high-level valid pulse signal, and the pulse width is three times the preset clock cycle, that is, the function of the first OR gate 927 is to widen the pulse width of the signal. Then the 2T_CLK_O signal obtained after the AND operation is performed on the PCS_OEN signal and the PCLK_OO signal by the first AND gate 928 includes two pulses, and the pulse width of each pulse is a preset clock cycle. At this time, the CA[4:0]_1T_E signal is decoded and sampled by using the 2T_CLK_O signal, to obtain a 2T CMD signal, and the 2T CMD signal is a high-level valid pulse signal, and the pulse width is twice the preset clock cycle within the preset precision range. The rising edge of the first pulse in the 2T_CLK_O signal is used for generating the rising edge of the 2T CMD signal, and the rising edge of the second pulse in the 2T_CLK_O signal is used for generating the falling edge of the 2T CMD signal. However, in this case, in the NT ODT CLK circuit, the PCS_E signal obtained after sampling and inverting the PCS signal with the rising edge of the PCLK_E signal is a high-level valid pulse signal, and the pulse width is twice the preset clock cycle. The PCS_O signal obtained after sampling and inverting the PCS signal with the rising edge of the PCLK_O signal is a low-level signal. Then the PCSB_O signal obtained after rising edge sampling and inverting processing is performed on the PCS_E signal by the ninth flip-flop 936 and the fifth inverter 937 is a low-level valid pulse signal, and the pulse width is twice the preset clock cycle. However, the NT_PCS_OEN1 signal obtained after the NOR operation is performed on the PCSB_O signal and the PCS_O signal by the third NOR gate 939 is a low-level signal, and then the NT_PCS_OEN2 signal obtained after falling edge sampling processing is performed on the NT_PCS_OEN1 signal by the first NOT gate 925 and the sixth flip-flop 926 is also a low-level signal. In this way, the NT_CLK_O signal obtained after the logic operation of the third OR gate 942 and the third AND gate 943 is a low-level signal, and the CA[4:0]_1T_E signal cannot be decoded and sampled by using the NT_CLK_O signal, at this time, the NT ODT CMD signal may not be outputted, so that the two types of instructions, 2T CMD and NT ODT CMD, may be distinguished and decoded accurately.

Responsive to the pulse width of the PCS signal being twice the preset clock cycle, FIG. 11 illustrates a schematic diagram of a signal timing sequence corresponding to a PCS signal provided by an embodiment of the disclosure when the rising edge of the even clock cycle is sampled as a low level and the rising edge of an adjacent next odd clock cycle is sampled as a low level. As illustrated in FIG. 11, in the 2T CLK circuit, after the CA signal is sampled by the rising edge of the PCLK_E signal, the CA[4:0]_1T_E signal is obtained, including C0 and C2. The PCS_E signal obtained after sampling and inverting the PCS signal with the rising edge of the PCLK_E signal is a high-level valid pulse signal, and the pulse width is twice the preset clock cycle. The PCS_O signal obtained after sampling and inverting the PCS signal with the rising edge of the PCLK_O signal is a high-level valid pulse signal, and the pulse width is twice the preset clock cycle, but is delayed by a preset clock cycle compared with the PCS_E signal. Then the PCSB_O signal obtained after rising edge sampling and inverting processing is performed on the PCS_E signal by the fifth flip-flop 922 and the third inverter 923 is a low-level valid pulse signal, which is an inversion signal to the PCS_O signal. Then the PCS_OEN1 signal obtained after the NOR operation is performed on the PCSB_O signal and the PCS_O signal by the first NOR gate 924 is a low-level signal, and then the PCS_OEN2 signal obtained after falling edge sampling processing is performed on the PCS_OEN1 signal by the first NOT gate 925 and the sixth flip-flop 926 is a low-level signal. In this way, the 2T_CLK_O signal obtained after the logic operation of the first OR gate 927 and the first AND gate 928 is a low-level signal, and the CA[4:0]_1T_E signal cannot be decoded and sampled by using the 2T_CLK_O signal, at this time, the 2T CMD signal may not be outputted. However, in this case, in the NT ODT CLK circuit, after the CA signal is sampled by the rising edge of the PCLK_E signal, the CA[4:0]_1T_E signal is obtained, including C0 and C2. The PCS_E signal obtained after sampling and inverting the PCS signal with the rising edge of the PCLK_E signal is a high-level valid pulse signal, and the pulse width is twice the preset clock cycle. The PCS_O signal obtained after sampling and inverting the PCS signal with the rising edge of the PCLK_O signal is a high-level valid pulse signal, and the pulse width is twice the preset clock cycle, but is delayed by a preset clock cycle compared with the PCS_E signal. Then the PCSB_O signal obtained after rising edge sampling and inverting processing is performed on the PCS_E signal by the ninth flip-flop 936 and the fifth inverter 937 is a low-level valid pulse signal, which is an inversion signal to the PCS_O signal. However, the NT_PCS_OEN1 signal obtained after the NOR operation is performed on the PCSB_O signal and the PCS_O NOT signal by the third NOR gate 939 is a high-level valid pulse signal, and the pulse width is twice the preset clock cycle, and there is a little delay compared with the PCS_O signal (the delay is caused by a logic device such as the third NOT gate 938 and the third NOR gate 939, which may be ignored). Then the NT_PCS_OEN2 signal obtained after falling edge sampling processing is performed on the NT_PCS_OEN1 signal by the first NOT gate 925 and the sixth flip-flop 926 is a high-level valid pulse signal, and the pulse width is twice the preset clock cycle, but is delayed by a preset clock cycle compared with the NT_PCS_OEN1 signal. In this way, the NT_PCS_OEN signal obtained after the OR operation is performed on the NT_PCS_OEN1 signal and the NT_PCS_OEN2 signal by the third OR gate 942 is a high-level valid pulse signal, and the pulse width is three times the preset clock cycle, that is, the function of the first OR gate 927 is to widen the pulse width of the signal. Then the NT_CLK_O signal obtained after the AND operation is performed on the NT_PCS_OEN signal and the PCLK_OO signal by the third AND gate 943 includes two pulses, and the pulse width of each pulse is a preset clock cycle. At this time, the CA[4:0]_1T_E signal is decoded and sampled by using the NT_CLK_O signal, to obtain an NT ODT CMD signal, and the NT ODT CMD signal is a high-level valid pulse signal, and the pulse width is twice the preset clock cycle within the preset precision range. The rising edge of the first pulse in the NT_CLK_O signal is used for generating the rising edge of the NT ODT CMD signal, and the rising edge of the second pulse in the NT_CLK_O signal is used for generating the falling edge of the NT ODT CMD signal, so that the two types of instructions, i.e., 2T CMD and NT ODT CMD, may also be correctly distinguished and decoded accurately.

In short, through the signal sampling circuit 60 described in the embodiment of the disclosure, the 2T CMD signal and the NT ODT CMD signal may be decoded separately without affecting each other. For the 2T CMD signal, the CS_n signal has a low level of only one preset clock cycle, which becomes the PCS_E signal after being sampled by the PCLK_E signal, and then becomes the PCSB_O signal after being sampled by the PCLK_O signal. The PCSB_O signal and the PCS_O signal are sampled after the NOR logic, to generate PCS_OEN1/2 to cover and generate the 2T_CLK_O signal. Finally, the 2T_CLK_O signal samples the CA[4:0]_1T_E signal, and the PCS_E signal outputs the 2T CMD signal. The other branch circuit is that NOR logic is performed on the PCSB_O signal and (the non-logic of the PCS_O signal, which is a high level), resulting in the low level of NT_PCS_OEN1/2, and the sampling clock is not generated, so that the NT ODT CMD signal is not outputted.

For the NT ODT CMD signal, the CS_n signal has a low level of two preset clock cycles, which are respectively PCS_E/O after being sampled by PCLK_E/O, and then the PCS_E signal is a PCSB_O signal after being sampled by PCLK_O. The NOR logic of the PCSB_O signal and the PCS_O signal just cancels each other out, resulting in that PCS_OEN1/2 is of a low level, and no sampling clock is generated, so the 2T CMD signal may not be outputted. The other branch circuit is that the NOR logic is performed on the PCSB_O signal and (the non-logic of the PCS_O signal, which is a low level), thereby generating PCS_OEN1/2 to cover the NT_CLK_O signal with two pulses, and finally this NT_CLK_O signal samples the CA[4:0]_1T_E signal, and the PCS_E signal outputs the NT ODT CMD signal.

In addition, in the embodiment of the disclosure, the timing waveforms provided in FIG. 10 and FIG. 11 are all in the case where the first chip select signal starts from an even clock cycle. Specifically, in a case that the pulse width of the initial chip select signal is a preset clock cycle, FIG. 10 illustrates the case that the first chip select signal is sampled to a low level at the rising edge of the even clock cycle and sampled to a high level at the rising edge of the next adjacent odd clock cycle. In the case that the pulse width of the initial chip select signal is twice the preset clock cycle, FIG. 11 illustrates the case that the first chip select signal is still sampled to a low level at the rising edge of the even clock cycle and sampled to a low level at the rising edge of the next adjacent odd clock cycle. Similarly, the case of the odd clock cycles is similar and may not be described in detail here.

The embodiments of the disclosure provide a signal sampling circuit, and the specific implementation of the foregoing embodiments is described in detail through this embodiment, from which it can be seen that based on the technical solutions of the embodiments of the disclosure, the problem of uncertainty of the pulse width of the target instruction signal may be avoided, and in a case that the pulse widths of the first chip select signals are different, two types of instructions, i.e., 2T CMD and NT ODT CMD, may also be correctly distinguished according to the resulting first chip select clock signal and the second chip select clock signal, and decoded accurately without affecting each other, thereby avoiding the problem of an incorrect operation caused by an instruction decoding error.

Figure 12:
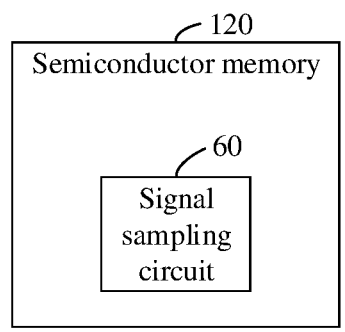
FIG. 12 is a schematic diagram of a composition structure of a semiconductor memory according to an embodiment of the disclosure.

In yet another embodiment of the disclosure, FIG. 12 illustrates a schematic diagram of a composition structure of a semiconductor memory 120 according to the embodiment of the disclosure. As illustrated in FIG. 12, the semiconductor memory 120 may include the signal sampling circuit 60 according to any item of the foregoing embodiment.

In the embodiment of the disclosure, the semiconductor memory 120 may be a DRAM chip.

Furthermore, in some embodiments, the DRAM chips conform to the DDR5 memory specification.

It is to be noted that the embodiments of the disclosure mainly relate to the related circuits of input signal sampling and instruction decoding in integrated circuit design, and in particular, to the DRAM chip. The CA signal input is used as a control adjustment circuit after sampling and decoding of the instruction and address, respectively. Specifically, the technical solutions of the embodiments of the disclosure solve the problem of distinguishing 2T CMD and NT ODT CMD sampling and decoding in DDR5, so that the 2T CMD signal and the NT ODT CMD signal may be distinguished according to the pulse width of the CS_n signal, and decoded accurately, without affecting each other.

In addition, it is also to be noted that the technical solutions of the embodiments of the disclosure may be applied to the control circuit of CA signal sampling and decoding in the DRAM chip, but are not limited to this scope, and other related circuits of input signal sampling and instruction decoding may adopt this design.

In this way, in the embodiments of the disclosure, the semiconductor memory 120 includes a signal sampling circuit 60. Therefore, the problem of uncertainty of the pulse width of the target instruction signal may be avoided, and in a case that the pulse widths of the first chip select signals are different, two types of instructions, i.e., 2T CMD and NT ODT CMD, can be correctly distinguished according to the resulting first chip select clock signal and the second chip select clock signal, and decoded accurately without affecting each other, thereby avoiding the problem of an incorrect operation caused by an instruction decoding error.

The above are only preferred embodiments of the disclosure, and are not intended to limit the protection scope of the disclosure.

It is to be noted that, the terms "including", "comprising" or any other variants thereof in the disclosure are intended to cover non-exclusive inclusion, so that a process, method, article or apparatus including a series of elements not only includes those elements, but also includes other elements that are not explicitly listed, or elements inherent to the process, method, article or apparatus. Without more restrictions, the element defined by the sentence "including a . . . " does not exclude the existence of other identical elements in the process, method, article or apparatus including the element.

The serial numbers of the embodiments of the disclosure are only for the purpose of description but do not represent the merits of the embodiments.

The methods disclosed in the method embodiments provided in the disclosure can be combined arbitrarily without conflict to obtain new method embodiments.

The features disclosed in the product embodiments provided in the disclosure can be combined arbitrarily without conflict to obtain new product embodiments.

The features disclosed in the method or device embodiments provided in the disclosure can be combined arbitrarily without conflict to obtain new method or device embodiments.

The descriptions above are only implementations of the disclosure. However, the protection scope of the disclosure is not limited thereto. Within the technical scope disclosed by the disclosure, any variation or substitution that can be easily conceived of by those skilled in the art should all fall within the protection scope of the disclosure. Therefore, the protection scope of the disclosure should be subject to the protection scope of the appended claims.

Embodiments of the disclosure provide a signal sampling circuit and a semiconductor memory. Based on the signal sampling circuit, in a case that the pulse widths of the first chip select signals are different, two types of instructions, i.e., 2T CMD and NT ODT CMD, can be correctly distinguished according to the resulting first chip select clock signal and the second chip select clock signal, and decoded accurately without affecting each other, thereby avoiding the problem of an incorrect operation caused by an instruction decoding error.

What is claimed is:

1. A signal sampling circuit, comprising a signal input circuit, a first instruction sampling circuit, a second instruction sampling circuit, and an instruction decoding circuit, wherein
the signal input circuit is configured to determine a to-be-processed instruction signal and a to-be-processed chip select signal according to a first clock signal, a first chip select signal, and a first command address signal, wherein a clock cycle of the first clock signal is twice a preset clock cycle;
the first instruction sampling circuit is configured to perform, responsive to a pulse width of the first chip select signal being the preset clock cycle, two-stage sampling and logic operation processing on the to-be-processed chip select signal according to the first clock signal, to obtain a first chip select clock signal;
the second instruction sampling circuit is configured to perform, responsive to the pulse width of the first chip select signal being twice the preset clock cycle, two-stage sampling and logic operation processing on the to-be-processed chip select signal according to the first clock signal, to obtain a second chip select clock signal; and
the instruction decoding circuit is configured to perform decoding and sampling processing on the to-be-processed instruction signal according to the to-be-processed chip select signal and the first chip select clock signal to obtain a target instruction signal, or perform decoding and sampling processing on the to-be-processed instruction signal according to the to-be-processed chip select signal and the second chip select clock signal to obtain the target instruction signal.

2. The signal sampling circuit of claim 1, wherein the target instruction signal comprises one pulse, and a pulse width of the pulse is twice the preset clock cycle, wherein
in a case that a pulse width of the first chip select signal is the preset clock cycle, the first chip select clock signal comprises two pulses, and a pulse width of each pulse is the preset clock cycle, and the second chip select clock signal keeps a level state unchanged; wherein a rising edge of a first pulse in the first chip select clock signal is configured to generate a rising edge of the target instruction signal, and a rising edge of a second pulse in the first chip select clock signal is configured to generate a falling edge of the target instruction signal;
in a case that a pulse width of the first chip select signal is twice the preset clock cycle, the first chip select clock signal keeps a level state unchanged; and the second chip select clock signal comprises two pulses, and a pulse width of each pulse is the preset clock cycle; wherein a rising edge of the first pulse in the second chip select clock signal is configured to generate a rising edge of the target instruction signal, and a rising edge of the second pulse in the second chip select clock signal is configured to generate a falling edge of the target instruction signal.

3. The signal sampling circuit of claim 1, wherein the signal input circuit comprises a receiving circuit and an input sampling circuit, wherein
the receiving circuit is configured to receive an initial command address signal, an initial chip select signal and an initial clock signal, and output the first command address signal, the first chip select signal and the first clock signal; and
the input sampling circuit is configured to perform sampling processing on the first chip select signal and the first command address signal according to the first clock signal to obtain the to-be-processed chip select signal and the to-be-processed instruction signal, wherein a clock cycle of the initial clock signal is the preset clock cycle.

4. The signal sampling circuit of claim 3, wherein the receiving circuit comprises a first receiving circuit, a second receiving circuit, and a third receiving circuit, wherein
the first receiving circuit is configured to receive the initial command address signal and output the first command address signal;
the second receiving circuit is configured to receive the initial chip select signal and output the first chip select signal; and
the third receiving circuit is configured to receive the initial clock signal, perform frequency division processing on the initial clock signal, and output a first clock odd signal and a first clock even signal; wherein the first clock signal is composed of the first clock odd signal and the first clock even signal, respective clock cycles of the first clock odd signal and the first clock even signal are twice the preset clock cycle, and a phase difference between the first clock odd signal and the first clock even signal is 180 degrees.

5. The signal sampling circuit of claim 4, wherein the input sampling circuit comprises a first sampling circuit, a second sampling circuit, a third sampling circuit, and a fourth sampling circuit, wherein
the first sampling circuit is configured to perform sampling processing on the first command address signal according to the first clock even signal, to obtain a to-be-processed instruction even signal;
the second sampling circuit is configured to perform sampling processing on the first command address signal according to the first clock odd signal, to obtain a to-be-processed instruction odd signal;
the third sampling circuit is configured to perform sampling and inverting processing on the first chip select signal according to the first clock even signal, to obtain a to-be-processed chip select even signal; and
the fourth sampling circuit is configured to perform sampling and inverting processing on the first chip select signal according to the first clock odd signal, to obtain a to-be-processed chip select odd signal;

wherein the to-be-processed instruction signal is composed of the to-be-processed instruction even signal and the to-be-processed instruction odd signal, and the to-be-processed chip select signal is composed of a to-be-processed chip select even signal and a to-be-processed chip select odd signal.

6. The signal sampling circuit of claim 5, wherein
the first sampling circuit comprises a first flip-flop, and an input terminal of the first flip-flop is inputted with the first command address signal, a clock terminal of the first flip-flop is inputted with the first clock even signal, and an output terminal of the first flip-flop is configured to output the to-be-processed instruction even signal;

the second sampling circuit comprises a second flip-flop, and an input terminal of the second flip-flop is inputted with the first command address signal, a clock terminal of the second flip-flop is inputted with the first clock odd signal, and an output terminal of the second flip-flop is configured to output the to-be-processed instruction odd signal;

the third sampling circuit comprises a third flip-flop and a first inverter; and an input terminal of the third flip-flop is inputted with the first chip select signal, a clock terminal of the third flip-flop is inputted with the first clock even signal, an output terminal of the third flip-flop is connected with an input terminal of the first inverter, and an output terminal of the first inverter is configured to output the to-be-processed chip select even signal; and the fourth sampling circuit comprises a fourth flip-flop and a second inverter; and an input terminal of the fourth flip-flop is inputted with the first chip select signal, a clock terminal of the fourth flip-flop is inputted with the first clock odd signal, an output terminal of the fourth flip-flop is connected with an input terminal of the second inverter, and an output terminal of the second inverter is configured to output the to-be-processed chip select odd signal.

7. The signal sampling circuit of claim 5, further comprising a first buffer and a second buffer, wherein
the first buffer is configured to perform delay processing on the first clock even signal to obtain a first clock delay even signal; and
the second buffer is configured to perform delay processing on the first clock odd signal to obtain a first clock delay odd signal.

8. The signal sampling circuit of claim 7, wherein the first instruction sampling circuit comprises a first logic circuit and a second logic circuit, wherein
the first logic circuit is configured to receive the first clock delay odd signal and the to-be-processed chip select even signal, and perform a two-stage sampling and logic operation on the to-be-processed chip select even signal by using the first clock delay odd signal, to obtain a first chip select clock odd signal; and
the second logic circuit is configured to receive the first clock delay even signal and the to-be-processed chip select odd signal, and perform a two-stage sampling and logic operation on the to-be-processed chip select odd signal by using the first clock delay even signal, to obtain a first chip select clock even signal;
wherein the first chip select clock signal is composed of the first chip select clock even signal and the first chip select clock odd signal.

9. The signal sampling circuit of claim 8, wherein
the first logic circuit comprises a fifth sampling circuit, a first NOR gate, a first NOT gate, a sixth sampling circuit, a first OR gate, and a first AND gate, wherein
the fifth sampling circuit is configured to perform sampling and inverting processing on the to-be-processed chip select even signal by using the first clock delay odd signal, to obtain a first intermediate sampling odd signal;
the first NOR gate is configured to perform a NOR operation on the first intermediate sampling odd signal and the to-be-processed chip select odd signal to obtain a second intermediate sampling odd signal;
the first NOT gate is configured to perform a NOT operation on the first clock delay odd signal to obtain a first inverted clock odd signal;
the sixth sampling circuit is configured to perform sampling processing on the second intermediate sampling odd signal by using the first inverted clock odd signal, to obtain a third intermediate sampling odd signal;
the first OR gate is configured to perform an OR operation on the second intermediate sampling odd signal and the third intermediate sampling odd signal to obtain a fourth intermediate sampling odd signal; and
the first AND gate is configured to perform an AND operation on the fourth intermediate sampling odd signal and the first clock delay odd signal to obtain the first chip select clock odd signal;
the second logic circuit comprises a seventh sampling circuit, a second NOR gate, a second NOT gate, an eighth sampling circuit, a second OR gate, and a second AND gate, wherein
the seventh sampling circuit is configured to perform sampling and inverting processing on the to-be-processed chip select odd signal by using the first clock delay even signal, to obtain a first intermediate sampling even signal;
the second NOR gate is configured to perform a NOR operation on the first intermediate sampling even signal and the to-be-processed chip select even signal to obtain a second intermediate sampling even signal;
the second NOT gate is configured to perform a NOT operation on the first clock delay even signal to obtain a first inverted clock even signal;
the eighth sampling circuit is configured to perform sampling processing on the second intermediate sampling even signal by using the first inverted clock even signal, to obtain a third intermediate sampling even signal;
the second OR gate is configured to perform an OR operation on the second intermediate sampling even signal and the third intermediate sampling even signal to obtain a fourth intermediate sampling even signal; and
the second AND gate is configured to perform an AND operation on the fourth intermediate sampling even signal and the first clock delay even signal to obtain the first chip select clock even signal.

10. The signal sampling circuit of claim 8, wherein the second instruction sampling circuit comprises a third logic circuit and a fourth logic circuit, wherein
the third logic circuit is configured to receive the first clock delay odd signal and the to-be-processed chip select even signal, and perform a two-stage sampling and logic operation on the to-be-processed chip select even signal by using the first clock delay odd signal, to obtain a second chip select clock odd signal; and the fourth logic circuit is configured to receive the first clock delay even signal and the to-be-processed chip select odd signal, and perform a two-stage sampling and logic operation on the to-be-processed chip select odd signal by using the first clock delay even signal, to obtain a second chip select clock even signal;

wherein the second chip select clock signal is composed of the second chip select clock even signal and the second chip select clock odd signal.

11. The signal sampling circuit of claim 10, wherein the third logic circuit comprises a ninth sampling circuit, a third NOT gate, a third NOR gate, a fourth NOT gate, a tenth sampling circuit, a third OR gate, and a third AND gate, wherein the ninth sampling circuit is configured to perform sampling and inverting processing on the to-be-processed chip select even signal by using the first clock delay odd signal, to obtain a fifth intermediate sampling odd signal;

the third NOT gate is configured to perform a NOT operation on the to-be-processed chip select odd signal to obtain a second chip select inverted odd signal;

the third NOR gate is configured to perform a NOR operation on the fifth intermediate sampling odd signal and the second chip select inverted odd signal to obtain a sixth intermediate sampling odd signal;

the fourth NOT gate is configured to perform a NOT operation on the first clock delay odd signal to obtain a second inverted clock odd signal;

the tenth sampling circuit is configured to perform sampling processing on the sixth intermediate sampling odd signal by using the second inverted clock odd signal, to obtain a seventh intermediate sampling odd signal;

the third OR gate is configured to perform an OR operation on the sixth intermediate sampling odd signal and the seventh intermediate sampling odd signal to obtain an eighth intermediate sampling odd signal; and the third AND gate is configured to perform an AND operation on the eighth intermediate sampling odd signal and the first clock delay odd signal to obtain the second chip select clock odd signal;

the fourth logic circuit comprises an eleventh sampling circuit, a fifth NOT gate, a fourth NOR gate, a sixth NOT gate, a twelfth sampling circuit, a fourth OR gate, and a fourth AND gate; wherein the eleventh sampling circuit is configured to perform sampling and inverting processing on the to-be-processed chip select odd signal by using the first clock delay even signal, to obtain a fifth intermediate sampling even signal;

the fifth NOT gate is configured to perform a NOT operation on the to-be-processed chip select even signal to obtain a second chip select inverted even signal;

the fourth NOR gate is configured to perform a NOR operation on the fifth intermediate sampling even signal and the second chip select inverted even signal to obtain a sixth intermediate sampling even signal;

the sixth NOT gate is configured to perform a NOT operation on the first clock delay even signal to obtain a second inverted clock even signal;

the twelfth sampling circuit is configured to perform sampling processing on the sixth intermediate sampling even signal by using the second inverted clock even signal, to obtain a seventh intermediate sampling even signal;

the fourth OR gate is configured to perform an OR operation on the sixth intermediate sampling even signal and the seventh intermediate sampling even signal to obtain an eighth intermediate sampling even signal; and the fourth AND gate is configured to perform an AND operation on the eighth intermediate sampling even signal and the first clock delay even signal to obtain the second chip select clock even signal.

12. The signal sampling circuit of claim 10, wherein the instruction decoding circuit comprises a first instruction decoding circuit and a second instruction decoding circuit, wherein the first instruction decoding circuit is configured to receive the first chip select clock signal, and perform decoding and sampling processing on the to-be-processed instruction signal according to the first chip select clock signal and the to-be-processed chip select signal, to obtain a first target instruction signal; and the second instruction decoding circuit is configured to receive the second chip select clock signal, and perform decoding and sampling processing on the to-be-processed instruction signal according to the second chip select clock signal and the to-be-processed chip select signal, to obtain a second target instruction signal.

13. The signal sampling circuit of claim 12, wherein the first instruction decoding circuit comprises a first decoding sampling circuit and a fifth OR gate, wherein the first decoding sampling circuit is configured to perform decoding and sampling processing on the to-be-processed instruction even signal according to the first chip select clock odd signal and the to-be-processed chip select even signal to obtain a first instruction even signal; and perform decoding and sampling processing on the to-be-processed instruction odd signal according to the first chip select clock even signal and the to-be-processed chip select odd signal to obtain a first instruction odd signal; and the fifth OR gate is configured to perform an OR operation on the first instruction even signal and the first instruction odd signal to obtain the first target instruction signal;

the second instruction decoding circuit comprises a second decoding sampling circuit and a sixth OR gate, wherein the second decoding sampling circuit is configured to perform decoding and sampling processing on the to-be-processed instruction even signal according to the second chip select clock odd signal and the to-be-processed chip select even signal to obtain a second instruction even signal; and perform decoding and sampling processing on the to-be-processed instruction odd signal according to the second chip select clock even signal and the to-be-processed chip select odd signal to obtain a second instruction odd signal; and the sixth OR gate is configured to perform an OR operation on the second instruction even signal and the second instruction odd signal to obtain the second target instruction signal.

14. The signal sampling circuit of claim 13, wherein the first decoding sampling circuit comprises a first decoding circuit, a thirteenth sampling circuit, a second decoding circuit, and a fourteenth sampling circuit, wherein the first decoding circuit is configured to perform decoding processing on the to-be-processed chip select even signal and the to-be-processed instruction even signal to obtain a first decoding even signal;

the thirteenth sampling circuit is configured to perform sampling processing on the first decoding even signal by using the first chip select clock odd signal, to obtain the first instruction even signal;

the second decoding circuit is configured to perform decoding processing on the to-be-processed chip select odd signal and the to-be-processed instruction odd signal to obtain a first decoding odd signal; and the fourteenth sampling circuit is configured to perform sampling processing on the first decoding odd signal by using the first chip select clock even signal, to obtain the first instruction odd signal;

the second decoding sampling circuit comprises a third decoding circuit, a fifteenth sampling circuit, a fourth decoding circuit, and a sixteenth sampling circuit; wherein the third decoding circuit is configured to perform decoding processing on the to-be-processed chip select even signal and the to-be-processed instruction even signal to obtain a second decoding even signal;

the fifteenth sampling circuit is configured to perform sampling processing on the second decoding even signal by using the second chip select clock odd signal, to obtain the second instruction even signal;

the fourth decoding circuit is configured to perform decoding processing on the to-be-processed chip select odd signal and the to-be-processed instruction odd signal to obtain a second decoding odd signal; and the sixteenth sampling circuit is configured to perform sampling processing on the second decoding odd signal by using the second chip select clock even signal, to obtain the second instruction odd signal.

15. The signal sampling circuit of claim 12, wherein the initial chip select signal is a signal representing that a target chip is selected, and the initial chip select signal is a low-level valid pulse signal; wherein when a pulse width of the initial chip select signal is the preset clock cycle, the first chip select clock signal is determined to be a valid pulse signal, and the first target instruction signal outputted by the first instruction decoding circuit is determined to be the target instruction signal;

when a pulse width of the initial chip select signal is twice the preset clock cycle, the second chip select clock signal is determined to be a valid pulse signal, and the second target instruction signal outputted by the second instruction decoding circuit is determined to be the target instruction signal.

16. The signal sampling circuit of claim 15, wherein
the first target instruction signal is a Command signal in a 5th Double Data Rate (DDR5) Dynamic Random Access Memory (DRAM) chip, and the Command signal is a read command signal, a write command signal, a refresh command signal, a precharge command signal, and an active command signal; and the second target instruction signal is a Non-Target ODT Command signal in the DDR5 DRAM chip.

17. The signal sampling circuit of claim 15, wherein in a case that the pulse width of the initial chip select signal is the preset clock cycle, when a rising edge of the first chip select signal in an even clock cycle is sampled as a low level, and a rising edge in a next adjacent odd clock cycle is sampled as a high level, the first chip select clock odd signal is determined to be a high-level valid pulse signal, and the first chip select clock odd signal has two pulses, wherein a rising edge of the first pulse in the first chip select clock odd signal is configured to generate a rising edge of the first target instruction signal, and a rising edge of the second pulse in the first chip select clock odd signal is configured to generate a falling edge of the first target instruction signal;

when a rising edge of the first chip select signal in an odd clock cycle is sampled as a low level, and a rising edge in a next adjacent even clock cycle is sampled as a high level, the first chip select clock even signal is determined to be a high-level valid pulse signal, and the first chip select clock even signal has two pulses, wherein a rising edge of the first pulse in the first chip select clock even signal is configured to generate a rising edge of the first target instruction signal, and a rising edge of the second pulse in the first chip select clock even signal is configured to generate a falling edge of the first target instruction signal.

18. The signal sampling circuit of claim 15, wherein in a case that the pulse width of the initial chip select signal is twice the preset clock cycle, when a rising edge of the first chip select signal in an even clock cycle is sampled as a low level, and a rising edge in a next adjacent odd clock cycle is still sampled as a low level, the second chip select clock odd signal is determined to be a high-level valid pulse signal, and the second chip select clock odd signal has two pulses, wherein a rising edge of the first pulse in the second chip select clock odd signal is configured to generate a rising edge of the second target instruction signal, and a rising edge of the second pulse in the second chip select clock odd signal is configured to generate a falling edge of the second target instruction signal;

when a rising edge of the first chip select signal in an odd clock cycle is sampled as a low level, and a rising edge in a next adjacent even clock cycle is still sampled as a low level, the second chip select clock even signal is determined to be a high-level valid pulse signal, and the second chip select clock even signal has two pulses, wherein a rising edge of the first pulse in the second chip select clock even signal is configured to generate a rising edge of the second target instruction signal, and a rising edge of the second pulse in the second chip select clock even signal is configured to generate a falling edge of the second target instruction signal.

19. A semiconductor memory, comprising a signal sampling circuit, wherein the signal sampling circuit comprises a signal input circuit, a first instruction sampling circuit, a second instruction sampling circuit, and an instruction decoding circuit;

the signal input circuit is configured to determine a to-be-processed instruction signal and a to-be-processed chip select signal according to a first clock signal, a first chip select signal, and a first command address signal, wherein a clock cycle of the first clock signal is twice a preset clock cycle;

the first instruction sampling circuit is configured to perform, responsive to a pulse width of the first chip select signal being the preset clock cycle, two-stage sampling and logic operation processing on the to-be-processed chip select signal according to the first clock signal, to obtain a first chip select clock signal;

the second instruction sampling circuit is configured to perform, responsive to the pulse width of the first chip select signal being twice the preset clock cycle, two-stage sampling and logic operation processing on the to-be-processed chip select signal according to the first clock signal, to obtain a second chip select clock signal; and the instruction decoding circuit is configured to perform decoding and sampling processing on the to-be-processed instruction signal according to the to-be-processed chip select signal and the first chip select clock signal to obtain a target instruction signal, or perform decoding and sampling processing on the to-be-processed instruction signal according to the to-be-processed chip select signal and the second chip select clock signal to obtain the target instruction signal.

20. The semiconductor memory of claim 19, wherein the semiconductor memory is a Dynamic Random Access Memory (DRAM) chip, and conforms to a 5th Double Data Rate (DDR5) memory specification.

* * * * *